US008759220B1

(12) United States Patent
Ogihara et al.

(10) Patent No.: US 8,759,220 B1
(45) Date of Patent: Jun. 24, 2014

(54) PATTERNING PROCESS

(71) Applicants: Shin-Etsu Chemical Co., Ltd., Tokyo (JP); International Business Machines Corporation, Armonk, NY (US)

(72) Inventors: Tsutomu Ogihara, Jyoetsu (JP); Takafumi Ueda, Jyoetsu (JP); Seiichiro Tachibana, Jyoetsu (JP); Yoshinori Taneda, Jyoetsu (JP); Martin Glodde, Yorktown Heights, NY (US); Margaret C. Lawson, Hopewell Junction, NY (US); Wu-Song Huang, Hopewell Junction, NY (US)

(73) Assignees: Shin-Etsu Chemical Co., Ltd., Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/780,999

(22) Filed: Feb. 28, 2013

(51) Int. Cl.
 *H01L 21/312* (2006.01)
(52) U.S. Cl.
 USPC .................................. 438/694; 257/E21.159
(58) Field of Classification Search
 None
 See application file for complete search history.

(56) References Cited

U.S. PATENT DOCUMENTS

| 5,632,910 | A | 5/1997 | Nagayama et al. | |
|---|---|---|---|---|
| 2002/0182514 | A1* | 12/2002 | Montgomery et al. | 430/5 |
| 2003/0235786 | A1 | 12/2003 | Krishnamurthy et al. | |
| 2004/0146790 | A1* | 7/2004 | Fuller et al. | 430/5 |
| 2005/0112383 | A1 | 5/2005 | Tanaka et al. | |
| 2007/0037410 | A1* | 2/2007 | Chang et al. | 438/780 |
| 2007/0238300 | A1 | 10/2007 | Ogihara et al. | |
| 2008/0118860 | A1 | 5/2008 | Harada et al. | |
| 2009/0136869 | A1 | 5/2009 | Ogihara et al. | |
| 2013/0005150 | A1* | 1/2013 | Ogihara et al. | 438/694 |

FOREIGN PATENT DOCUMENTS

| JP | A-61-185928 | 8/1986 |
|---|---|---|
| JP | A-07-181688 | 7/1995 |
| JP | A-07-183194 | 7/1995 |
| JP | A-11-258813 | 9/1999 |
| JP | A-2005-173552 | 6/2005 |
| JP | A-2005-520354 | 7/2005 |
| JP | A-2005-537502 | 12/2005 |

(Continued)

OTHER PUBLICATIONS

Maenhoudt et al., "Double Patterning scheme for sub-0.25 k1 single damascene structures at NA=0.75, λ-193nm," *Proceedings of SPIE*, pp. 1508-1518, 2005, vol. 5754, Bellingham, WA.

(Continued)

*Primary Examiner* — Seahvosh Nikmanesh
(74) *Attorney, Agent, or Firm* — Oliff PLC

(57) ABSTRACT

A patterning process includes (1) forming, on a body to be processed on which a titanium-containing hard mask is formed, an organic underlayer film; (2) forming, on the organic underlayer film, a titanium-containing resist underlayer film having a titanium content of 10% to 60% by mass; (3) forming a photoresist film on the titanium-containing resist underlayer film; (4) forming a photoresist pattern by exposing the photoresist film and developing; (5) pattern-transferring onto the titanium-containing resist underlayer film by using the photoresist pattern as a mask; (6) pattern-transferring onto the organic underlayer film by using the titanium-containing resist underlayer film as a mask; and (7) removing the titanium-containing hard mask and the titanium-containing resist underlayer film by wet stripping method. A patterning process including removing a resist underlayer film using a wet stripper having a milder condition than the conventional stripper without causing damage to a body to be processed.

46 Claims, 1 Drawing Sheet

(56) References Cited

FOREIGN PATENT DOCUMENTS

| | | |
|---|---|---|
| JP | A-2006-251369 | 9/2006 |
| JP | A-2006-317864 | 11/2006 |
| JP | A-2007-199653 | 8/2007 |
| JP | A-2007-302873 | 11/2007 |
| JP | A-2008-111103 | 5/2008 |
| JP | A-2009-126940 | 6/2009 |
| JP | B2-4716037 | 4/2011 |
| WO | WO 2004/007192 A1 | 1/2004 |

OTHER PUBLICATIONS

Nakamura et al., "Contact Hole Formation by Multiple Exposure Technique in Ultra-low $k_1$ Lithography," *Proceedings of SPIE*, pp. 255-263, 2004, vol. 5377, Bellingham, WA.

\* cited by examiner

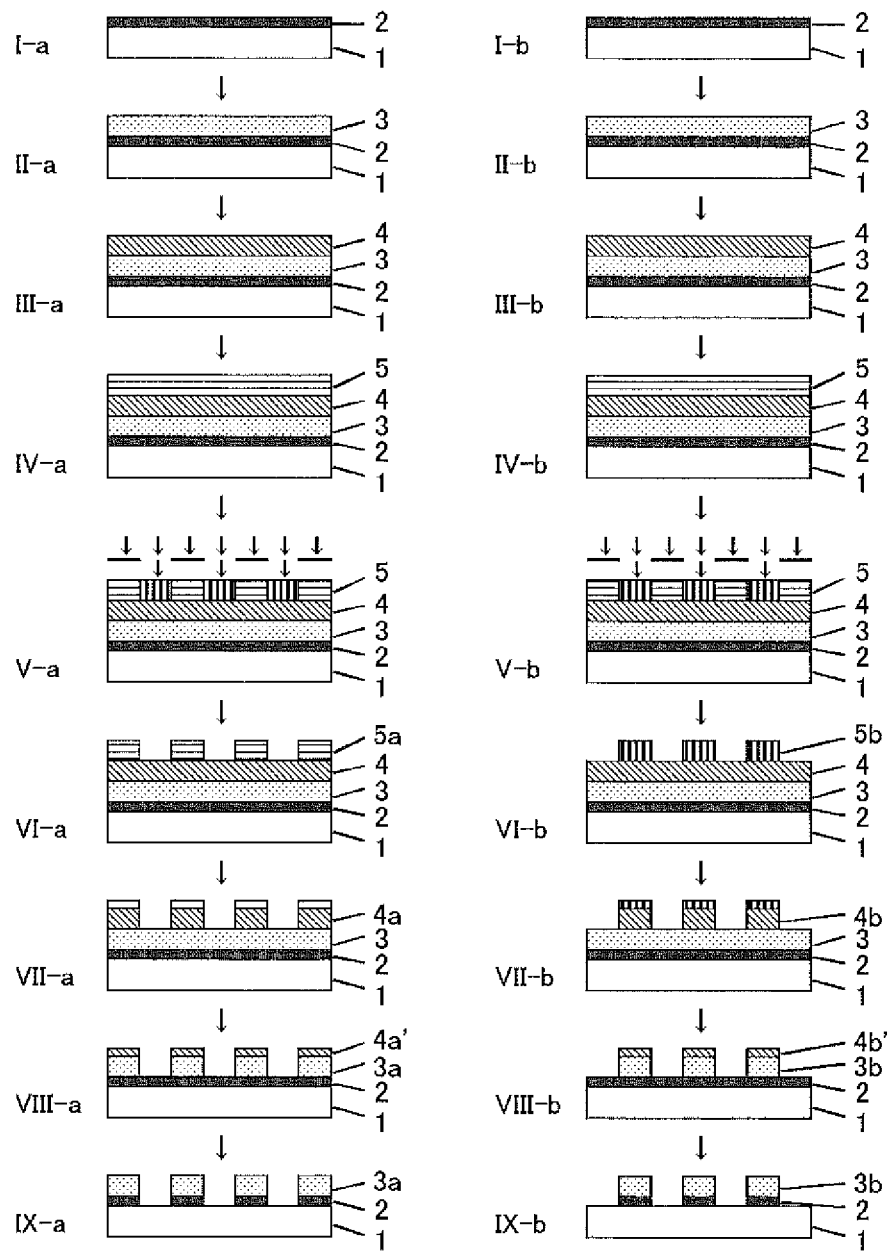

PATTERNING PROCESS

BACKGROUND OF THE INVENTION

1. Field of the Invention

The present invention relates to a patterning process by a multilayer resist method used for microfabrication in a step of producing a semiconductor device.

2. Description of the Related Art

As exposure light used for formation of a resist pattern, light exposure using g-beam (436 nm) or i-beam (365 nm) from a mercury lamp as a light source was widely used in 1980s. A method for shifting to a shorter wavelength of exposure light was considered to be effective as the means for further miniaturization. As a result, in the mass production process after DRAM (Dynamic Random Access Memories) with 64 MB (processing feature size: 0.25 µm or less) in 1990s, the exposure light source of i-beam (365 nm) was replaced by a KrF excimer laser having a shorter wavelength of 248 nm. However, for production of DRAM with an integration degree of 256 MB and 1 GB or more requiring miniaturized process technologies (processing feature size: 0.2 µm or less), a shorter wavelength light source was required. Over a decade, photolithography using an ArF excimer laser (193 nm) has been fully investigated. At first, it was expected that the ArF lithography would be applied to the production of 180-nm node devices. However, the KrF excimer lithography lived long to the mass production of 130-nm node devices. The full-fledged application of ArF lithography started from the 90-nm node. Further, the ArF lithography combined with a lens having an increased NA of 0.9 has been applied to the mass production of 65-nm node devices. The next 45-nm node devices has required an advancement to shift to a shorter wavelength of exposure light, and the $F_2$ lithography having a wavelength of 157 nm has become a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. For these various problems, the development of $F_2$ lithography has been stopped and ArF immersion lithography has been introduced.

In the ArF immersion lithography, the space between a projection lens and a wafer is filled with water having a refractive index of 1.44 by a partial filling manner. This enables high-speed scanning. A lens having a NA of 1.3 is applied to mass production of 45-nm node devices.

One of the candidates for 32-nm node lithography technique is extreme ultraviolet (EUV) lithography having a wavelength of 13.5 nm. Then, exemplary objects accompanying to the EUV lithography are to increase an output of laser, enhance a sensitivity of resist film, enhance a resolution, decrease a line edge roughness (LER), achieve a defect-free MoSi laminate mask, lower aberrations of a reflecting mirror, for example, thereby leaving a pile of objects to be attained. The development of a high refractive index liquid immersion lithography which is another candidate for the 32-nm node lithography has been stopped since the transmittance of LUAG which is a candidate for a high refractive index lens is low and the refractive index of liquid does not achieve a desired value of 1.8. As described above, light exposure used as the general purpose technology approaches the limit of essential resolution introduced by the wavelength of a light source.

One of miniaturized process technologies that draw attention in recent years is a double patterning process involving performing a first set of exposure and development to form a first pattern and performing a second set of exposure and development to form a pattern between features of the first pattern (Non-patent document 1). A large number of processes are proposed as the double patterning process. For example, there is a process involving performing a first set of exposure and development to form a photoresist pattern having line-and-space at intervals of 1:3, processing the underlying hard mask by dry etching, applying another hard mask thereto, performing a second set of exposure and development of a photoresist film to form a line pattern in the spaces of the first exposure, and processing the hard mask by dry etching, thereby forming a line-and-space pattern at a half pitch of the first pattern. An another process involves performing a first set of exposure and development to form a photoresist pattern having spaces and lines at intervals of 1:3, processing the underlying layer of hard mask by dry etching, applying a photoresist film thereto, performing a second set of exposure and development to form a second space pattern on the remaining hard mask portion, and processing the hard mask by dry etching. While the former process requires two applications of hard mask, the latter process uses one layer of hard mask but requires to form a trench pattern which is difficult to resolve as compared with the line pattern. In both the processes, the hard mask is processed by two dry etchings.

As the other finer patterning technology, a process involving forming a line pattern in the X direction on a positive resist film by dipole illumination, hardening the resist pattern, applying a resist composition thereto, exposing the line pattern in the Y direction to dipole illumination, and forming a hole pattern from gaps of a lattice line pattern (Non-patent document 2) is proposed.

As one of methods for transferring a lithography pattern onto a substrate using a hard mask as described above, there is a multilayer resist method. The multilayer resist method involves interposing an middle layer film having a different selectivity, for example, a silicon-containing resist underlayer film, between a photoresist film, that is, a resist upper layer film, and a substrate to be processed, forming a pattern on the resist upper layer film, transferring the pattern onto the resist underlayer film using the resist upper layer film as an etching mask, and transferring the pattern onto the substrate to be processed using the resist underlayer film as an etching mask.

As a composition for an underlayer film used in such a multilayer resist method, a composition for forming a silicon-containing film is well known. Examples thereof include a silicon-containing inorganic film, a $SiO_2$ film (Patent document 1) and a SiON film (Patent document 2), which are obtained by CVD, and a spin on glass (SOG) film (Patent document 3) and a crosslinkable silsesquioxane film (Patent document 4), which are obtained by spin-coating.

The lithography characteristics and stability of a composition for forming a silicon-containing resist underlayer film have been investigated. Patent document 5 discloses that when a composition for forming a resist underlayer film containing a thermal crosslinking accelerator is prepared, a resist underlayer film having good etching selectivity and storage stability is provided. However, as the finer patterning of a semiconductor device is promoted, the line width of the pattern is reduced, and the film thickness of a resist upper layer film is reduced to prevent pattern fall. Therefore, improved adhesion and etching selectivity in the finer pattern than the conventional patterns are required in performances needed in a resist underlayer film.

Most of a coating film practically used in the conventional multilayer resist method has been an organic film and the silicon-containing film as described above. However, in a process for producing a semiconductor device in a marginal domain of lithography by the recent light exposure, a complicated process such as the double patterning process has been proposed. Therefore, it is difficult to construct a reasonable production process using only the conventional organic film and a silicon-containing film. In order to construct a more reasonable production process of a semiconductor device, it is required that a coating film which has an etching selectivity to both film components of an organic film and a silicon-containing film, and can be separated under a mild condition without causing damage to the substrate after exhibiting an etching mask function which is one of functions of the underlayer film, that is, after pattern-transferring from the underlayer film.

PRIOR ART DOCUMENTS

Patent Documents

Patent Document 1: Japanese Patent Laid-Open Publication No. 7-183194
Patent Document 2: Japanese Patent Laid-Open Publication No. 7-181688
Patent document 3: Japanese Patent Laid-Open Publication No. 2007-302873
Patent Document 4: Japanese Patent Application Publication No. 2005-520354
Patent document 5: Japanese Patent No. 4716037
Patent Document 6: Japanese Patent Laid-Open Publication No. 11-258813
Patent document 7: Japanese Patent Laid-Open Publication No. 2006-251369
Patent Document 8: Japanese Patent Application Publication No. 2005-537502
Patent document 9: Japanese Patent Laid-Open Publication No. 2005-173552
Patent Document 10: Japanese Patent Laid-Open Publication No. 2006-317864

Non-Patent Documents

Non-patent document 1: Proc. SPIE Vol. 5754 p. 1508 (2005)
Non-patent document 2: Proc. SPIE Vol. 5377 p. 255 (2004)

SUMMARY OF THE INVENTION

Under such circumstances, resist underlayer films of various metal species have been proposed. Among the proposals, a coating film expected for the etching selectivity and stripping performance as described above is a titanium-containing coating film (Patent documents 6 to 10). For example, Patent document 6 describes a process using polytitanoxane as a coating film. With respect to stripping of the coating film, only dry stripping is described, but wet stripping is not mentioned. With respect to stripping of a coating film, Patent document 7 discloses dry stripping and wet stripping using 1% hydrofluoric acid. However, this is not practical since hydrofluoric acid may erode circuits formed on a substrate. Patent document 8 proposes wet stripping using a developer of tetramethyl ammonium hydroxide or potassium hydroxide. Patent documents 9 and 10 propose wet stripping using an acid or an alkali similar to a resist stripper. However, it is required that a coating film which can be stripped under a milder condition for use in a complicated process in the recent microfabrication, and a patterning process using the same.

The present invention is to improve such a situation. An object of the present invention is to provide a patterning process including removing a resist underlayer film using a wet stripper having a milder condition than the conventional stripper without causing damage to a body to be processed.

In order to solve the above-described problems, the present invention provides a patterning process comprising the steps of:

(1) forming, on a body to be processed on which a titanium-containing hard mask is formed, an organic underlayer film by using an application-type organic underlayer film composition;
(2) forming, on the organic underlayer film, a titanium-containing resist underlayer film by using a composition for forming a titanium-containing resist underlayer film, the composition containing titanium in the amount of 10% to 60% by mass;
(3) forming a photoresist film by using a chemically amplified resist composition on the titanium-containing resist underlayer film;
(4) after heat-treatment, forming a photoresist pattern by exposing the photoresist film to high energy beam and developing;
(5) pattern-transferring onto the titanium-containing resist underlayer film by using the photoresist pattern as a mask;
(6) pattern-transferring onto the organic underlayer film by using the titanium-containing resist underlayer film having the transferred pattern as a mask; and
(7) removing an exposed area of the titanium-containing hard mask and the titanium-containing resist underlayer film by wet stripping method.

The present invention also provides a patterning process comprising the steps of:

(1) forming, on a body to be processed on which a titanium-containing hard mask is formed, an organic hard mask mainly comprising carbon by a CVD method;
(2) forming, on the organic hard mask, a titanium-containing resist underlayer film by using a composition for forming a titanium-containing resist underlayer film, the composition containing titanium in the amount of 10% to 60% by mass;
(3) forming a photoresist film by using a chemically amplified resist composition on the titanium-containing resist underlayer film;
(4) after heat-treatment, forming a photoresist pattern by exposing the photoresist film to high energy beam and developing;
(5) pattern-transferring onto the titanium-containing resist underlayer film by using the photoresist pattern as a mask;
(6) pattern-transferring onto the organic hard mask by using the titanium-containing resist underlayer film having the transferred pattern as a mask; and
(7) removing an exposed area of the titanium-containing hard mask and the titanium-containing resist underlayer film by the wet stripping method.

According to such patterning processes, a body to be processed in which a titanium-containing resist underlayer film is removed by using a wet stripper having a milder condition than the conventional stripper can be obtained without causing damage thereof.

It is preferable that the photoresist pattern be a positive-pattern formed by development conducted by dissolving the exposed area of the photoresist film with an alkaline developer.

It is preferable that the photoresist pattern be a negative-pattern formed by development conducted by dissolving a non-exposed area of the photoresist film with a developer of an organic solvent.

The patterning process of the present invention can be applied to both positive and negative development processes.

In the removing step by the wet stripping method, it is preferable that the exposed area of the titanium-containing hard mask and the titanium-containing resist underlayer film be removed by a stripper containing hydrogen peroxide.

By using a stripper containing hydrogen peroxide, the titanium-containing resist underlayer film can be surely removed without causing damage to a body to be processed under a mild condition which does not cause damage to the body to be processed.

In the removing step by the wet stripping method, it is preferable that an exposed area of the titanium-containing hard mask and the titanium-containing resist underlayer film be stripped simultaneously.

By thus stripping them simultaneously, the removing step can be efficiently performed.

Further, in the removing step by the wet stripping method, it is preferable that the stripping rate of the titanium-containing resist underlayer film be faster than that of the exposed area of the titanium-containing hard mask.

According to the removing step, the titanium-containing resist underlayer film can be surely removed.

It is preferable that the titanium-containing hard mask be any one of a titanium film, a titanium carbide film, a titanium oxide film, a titanium nitride film, a titanium silicide film, a titanium oxycarbide film, a titanium carbon nitride film, and a titanium oxynitride film.

It is preferable that the titanium-containing hard mask be formed by a spin-coating method, a CVD method, or an ALD method.

By forming such a titanium-containing hard mask, the titanium-containing resist underlayer film and the exposed area of thereby can be removed simultaneously in the removing step. Further, a pattern can be transferred onto a body to be processed without a difference in size conversion.

It is preferable that the body to be processed be a semiconductor substrate coated, as a layer to be processed, with any of a metal film, a metal carbide film, a metal oxide film, a metal nitride film, a metal oxycarbide film, and a metal oxynitride film.

It is preferable that the metal that constitutes the body to be processed be silicon, titanium, tungsten, hafnium, zirconium, chromium, germanium, copper, aluminum, indium, gallium, arsenic, palladium, iron, tantalum, iridium, molybdenum, or an alloy of these metals.

According to the patterning process of the present invention, such a body to be processed can be processed to form a pattern.

It is preferred that the photoresist film be exposed by the method of photolithography with a wavelength of 300 nm or less or an EUV beam or by the method of a direct drawing with an electron beam.

By such a method, a finer pattern can be formed on a photoresist film.

It is preferable that the composition for forming a titanium-containing resist underlayer film contain, as a component (A), a titanium-containing compound obtained by hydrolysis and/or condensation of one or more kinds of titanium compounds represented by the following general formula (A-I):

$$Ti(OR^{OA})_4 \quad (A\text{-}I)$$

wherein, $R^{OA}$ represents an organic group having 1 to 30 carbon atoms.

A titanium-containing resist underlayer film formed by using such a composition for forming a titanium-containing resist underlayer film can be removed under a milder condition.

It is preferable that the composition for forming a titanium-containing resist underlayer film contain, as a component (B), a silicon-containing compound obtained by hydrolysis and/or condensation of one or more kinds of silicon compounds represented by the following general formula (B-I):

$$R^{1B}_{b1}R^{2B}_{b2}R^{3B}_{b3}Si(OR^{OB})_{(4-b1-b2-b3)} \quad (B\text{-}I)$$

wherein, $R^{OB}$ represents a hydrocarbon group having 1 to 6 carbon atoms; $R^{1B}$, $R^{2B}$ and $R^{3B}$ represent a hydrogen atom or a monovalent organic group having 1 to 30 carbon atoms; and b1, b2, and b3 are 0 or 1, and satisfy $1 \leq b1+b2+b3 \leq 3$.

It is preferable that the component (B) contains a silicon-containing compound obtained by hydrolysis and/or condensation of one or more kinds of silicon compounds represented by the general formula (B-I) and one or more kinds of silicon compounds represented by the following general formula (B-II):

$$Si(OR^{4B})_4 \quad (B\text{-}II)$$

wherein, $R^{4B}$ represents a hydrocarbon group having 1 to 6 carbon atoms.

It is preferable that any one or more of $R^{1B}$, $R^{2B}$ and $R^{3B}$ in the general formula (B-I) be an organic group containing a hydroxyl group or a carboxyl group, the groups being substituted with an acid-labile group.

A titanium-containing resist underlayer film formed by using such a composition for forming a titanium-containing resist underlayer film can be used to improve the adhesion with a photoresist pattern.

According to the patterning process of the present invention, a wet stripper having a milder condition than the conventional stripper can be used to remove a resist underlayer film without causing damage to a body to be processed, and a finer pattern can be formed on the body to be processed. Thus, a process for further microfabrication such as double patterning process can be applied.

DESCRIPTION OF THE DRAWINGS

FIG. 1 is a schematic view showing an aspect of a patterning process according to the present invention.

DETAILED DESCRIPTION OF THE PREFERRED EMBODIMENTS

The present inventors have investigated the lithography characteristics and stability of a composition for forming a silicon-containing resist underlayer film, and formed a resist underlayer film having good etching selectivity and storage stability by using a silicon-containing compound. However, the miniaturized process of a semiconductor device is promoted, the line width of the pattern is miniaturized, and the structure of logical circuit in the semiconductor device is complicated. For example, in the multilayer resist method using the conventional silicon-containing resist underlayer film, a silicon-containing resist underlayer film used as an etching mask remains on an organic film as a residue in a thickness of several nanometers after completion of processing the organic film. In general, the residue can be completely removed on the organic film in the next processing of a substrate to be processed. On the other hand, as another process, removing of residue of silicon-containing resist underlayer film before processing of a substrate to be processed is possible in theory. However, if the silicon-containing resist film is stripped by dry stripping (dry rework), that is, by dry etching, plasma generated in the dry stripping step causes damage to the surface of substrate to be processed which is bared by pattern-transferring. Thus, the process is impossible in fact. A process for removing the residue of the silicon-containing resist underlayer film by wet stripping is possible in theory. However, when hydrofluoric acid-based stripper most effective in wet stripping of a silicon-containing resist underlayer film is used, damage may be caused not only to the bared surface of a substrate but also to the whole wafer. Therefore, in the process substantially using a silicon-containing resist underlayer film, the residue of the silicon-containing resist underlayer film remained after processing an organic film needs to be removed simultaneously when a substrate to be processed is processed.

On the other hand, it has been known that a resist film of a titanium-containing compound can be stripped with a stripper containing hydrogen peroxide. In Japanese Patent Laid-Open Publication No. 61-185928, titanium nitride is used as a resist underlayer film, and the resist underlayer film is removed by a stripper containing hydrogen peroxide. However, there was no patterning technology by ArF exposure at the time. Therefore, it is not clear whether or not an ArF pattern can be formed by this process. The present inventors have intensively studied that a titanium-containing compound can be applied to a resist underlayer film for microfabrication such as a current ArF exposure process. As a result, they have constructed a patterning process by a multilayer resist method using a titanium-containing resist underlayer film having particular titanium content. Thus, the present invention has been completed.

Hereinafter, an aspect of the present invention will be described using drawings, but the present invention is not limited to the aspect.

FIG. 1 is a schematic view showing an aspect of a patterning process according to the present invention.

In a step (1), an organic underlayer film 3 is formed by using an application-type organic underlayer film composition on a body to be processed 1 on which a titanium-containing hard mask 2 is formed, or an organic hard mask (not shown) mainly containing carbon is formed (FIGS. 1(I-a) and 1(II-a)). In a step (2), a titanium-containing resist underlayer film 4 is formed by using a composition for forming a titanium-containing resist underlayer film, the composition containing titanium in the amount of 10% to 60% by mass, on the organic hard mask 3 or the organic hard mask (not shown) (FIG. 1(III-a)). In a step (3), a photoresist film 5 is formed by using a chemically amplified resist composition on the titanium-containing resist underlayer film 4 (FIG. 1(IV-a)). In a step (4), after heat-treatment, a photoresist pattern 5a (positive photoresist pattern 5a) is formed by exposing the photoresist film 5 to high energy beam and developing (FIGS. 1(V-a) and (VI-a)). In a step (5), a titanium-containing resist underlayer film pattern 4a is formed by pattern-transferring onto the titanium-containing resist underlayer film 4 by using the photoresist pattern 5a as a mask (FIG. 1(VII-a)). In a step (6), an organic underlayer film pattern 3a or an organic hard mask pattern (not shown) is formed by pattern-transferring onto the organic underlayer film 3 or the organic hard mask (not shown) by using the titanium-containing resist underlayer film pattern 4a as a mask (FIG. 1(VIII-a)). In a step (7), an exposed area of the titanium-containing hard mask 2 and a residue 4a' of the titanium-containing resist underlayer film are removed by the wet stripping method (FIG. 1(IX-a)).

According to one aspect of the patterning process of the present invention as described above, a positive photoresist pattern 5a is able to form by development conducted by dissolving an exposed area of photoresist film 5 with an alkaline developer in the development step. On the other hand, in development step, a negative photoresist pattern 5b is able to form by development conducted by dissolving a non-exposed area of photoresist film 5 with a developer of an organic solvent, instead of the alkaline developer (FIGS. 1(I-b) to 1(IX-b)).

Hereinafter, each step will be described in detail.

In the step (1), the organic underlayer film 3 is formed by using an application-type organic underlayer film composition on the body to be processed 1 on which the titanium-containing hard mask 2 is formed (FIGS. 1(I-a) and 1(II-a)).

As the body to be processed 1, a semiconductor substrate coated, as a layer to be processed (area to be processed), with any of a metal film, a metal carbide film, a metal oxide film, a metal nitride film, a metal oxycarbide film, and a metal oxynitride film can be employed.

As the semiconductor substrate, a silicon substrate is generally used, but not particularly limited. The material quality different from that of the layer to be processed, such as Si, amorphous silicon (α-Si), p-Si, $SiO_2$, SiN, SiON, W, TiN, and Al may be employed as semiconductor substrate.

As a metal that constitutes the body to be processed, any of silicon, titanium, tungsten, hafnium, zirconium, chromium, germanium, copper, aluminum, and iron, or an alloy of these metals can be used. As a layer to be processed containing such a metal, Si, $SiO_2$, SiN, SiON, SiOC, p-Si, α-Si, TiN, WSi, BPSG, SOG, Cr, CrO, CrON, MoSi, W, W—Si, Al, Cu, Al—Si, various low dielectric films, or an etching stopper film thereof can be used. The thickness of film to be formed is usually 50 to 10,000 nm, particularly 100 to 5,000 nm.

A titanium-containing hard mask is formed on such a body to be processed. It is preferable that such a titanium-containing hard mask be any one of a titanium film, a titanium carbide film, a titanium oxide film, a titanium nitride film, a titanium silicide film, a titanium oxycarbide film, a titanium carbon nitride film, and a titanium oxynitride film. It is preferable that the forming method be a spin-coating method, a CVD method, or an ALD method.

The organic underlayer film 3 formed by using an application-type organic underlayer film composition or an organic hard mask (not shown) mainly containing carbon is formed on the body to be processed 1 on which such a titanium-containing hard mask 2 is formed. The organic underlayer film and organic hard mask are not particularly limited, and can be exemplified by a substance expressing a sufficient anti-reflection film function when a photoresist film is exposed. When the organic underlayer film and organic hard mask are formed, a pattern formed by a photoresist film can be transferred onto a body to be processed without a difference in size conversion.

In the step (2), the titanium-containing resist underlayer film 4 is formed by using a composition for forming a titanium-containing resist underlayer film, the composition containing titanium in the amount of 10% to 60% by mass, on the organic hard mask 3 or the organic hard mask (not shown) (FIG. 1(III-a)).

It is preferable that the composition for forming a titanium-containing resist underlayer film which forms the titanium-containing resist underlayer film 4 contain, as a component (A), a titanium-containing compound obtained by hydrolysis and/or condensation of one or more kinds of titanium compounds represented by the following general formula (A-I):

$$Ti(OR^{OA})_4 \qquad (A\text{-}I)$$

wherein, $R^{OA}$ represents an organic group having 1 to 30 carbon atoms.

Examples of titanium compound represented by the general formula (A-I) include titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis(2,4-pentanedionate), titanium dibutoxy bis(2,4-pentanedionate), and an oligomer as a partially hydrolyzed condensate thereof.

The titanium compound can be hydrolyzed and/or condensed in the absence of a catalyst or in the presence of an acid or an alkaline catalyst to prepare a titanium-containing compound. At this time, as the acid catalyst, one or more compounds selected from an inorganic acid, an aliphatic sulfonic acid, an aromatic sulfonic acid, an aliphatic carboxylic acid, and an aromatic carboxylic acid can be used.

Specific examples of the acid catalyst include hydrofluoric acid, hydrochloric acid, hydrobromic acid, sulfuric acid, nitric acid, perchloric acid, phosphoric acid, methanesulfonic acid, benzenesulfonic acid, toluene sulfonic acid, formic acid, acetic acid, propionic acid, oxalic acid, malonic acid, maleic acid, fumaric acid, and benzoic acid. The amount of catalyst to be used is preferably $10^{-6}$ to 10 moles, more preferably $10^{-5}$ to 5 moles, further preferably $10^{-4}$ to 1 moles, relative to 1 mole of titanium compound.

Examples of alkaline catalyst to be used include methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetramine, aniline, N,N-dimethylaniline, pyridine, N,N-dimethylethanolamine, N,N-diethylethanolamine, N-(β-aminoethyl)ethanolamine, N-methylethanolamine, N-methyldiethanolamine, N-ethylethanolamine, N-n-butylethanolamine, N-n-butyldiethanolamine, N-tert-butylethanolamine, N-tert-butyldiethanolamine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of alkaline catalyst to be used is preferably $10^{-6}$ to 10 moles, more preferably $10^{-5}$ to 5 moles, further preferably $10^{-4}$ to 1 moles, relative to 1 mole of titanium compound.

The amount of water when the titanium-containing compound is obtained is preferably 0.01 to 10 moles, more preferably 0.05 to 5 moles, further preferably 0.1 to 3 moles, relative to 1 mole of hydrolyzable substituent bonded to the titanium-containing compound. When the amount is 10 moles or less, a device used for a reaction is not huge, and therefore it is economic and the stability of the titanium-containing compound is not impaired. Accordingly, this is preferable.

A titanium compound is added to a catalyst aqueous solution as an operation procedure, to initiate a hydrolysis-condensation reaction. At this time, an organic solvent may be added to the catalyst aqueous solution, the titanium compound may be diluted with an organic solvent, or both the operations may be performed. The reaction temperature is preferably 0 to 200° C., more preferably 5 to 150° C. A method in which the temperature is kept to 5 to 150° C. during addition of titanium compound, followed by aging at 20 to 150° C. is preferable.

As another reaction operation, water or aqueous organic solvent is added to a titanium compound or an organic solvent of titanium compound to initiate a hydrolysis reaction. At this time, a catalyst may be added to a titanium compound or an organic solvent of titanium compound, or to water or an aqueous organic solvent. The reaction temperature is preferably 0 to 200° C., more preferably 5 to 150° C. A method in which the temperature is kept to 5 to 150° C. during addition of titanium compound, followed by aging at 20 to 150° C. is preferable.

Examples of an organic solvent which can be added to a catalyst aqueous solution or can be used to dilute a titanium compound include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylenegylcol monomethyl ether, ethylenegylcol monomethyl ether, butanediol monoethyl ether, propylenegylcol monoethyl ether, ethylenegylcol monoethyl ether, propylenegylcol dimethyl ether, diethylene glycol dimethyl ether, propylene gylcol monomethyl ether acetate, propylenegylcol monoethyl ether acetate, ethyl pilvate, butyl acetate, methyl 3-methoxypropionate, ethyl 3-ethoxypropionate, tert-butyl acetate, tert-butyl propionate, propylenegylcol mono-tert-butyl ether acetate, γ-butyrolactone, acetylacetone, methyl acetoacetate, ethyl acetoacetate, propyl acetoacetate, butyl acetoacetate, methyl pivaloyl acetate, methyl isobutyloyl acetate, methyl caproyl acetate, methyl lauroyl acetate, 1,2-ethanediol, 1,2-propanediol, 1,2-butanediol, 1,2-pentanediol, 2,3-butanediol, 2,3-pentanediol, glycerol, diethylene glycol, hexylene glycol, and mixtures thereof.

The amount of the organic solvent to be used is preferably 0 to 1,000 mL, particularly preferably 0 to 500 mL, relative to 1 mole of titanium compound. When the amount of the organic solvent to be used is 1,000 mL or less, a reaction vessel is not huge, and therefore it is economic.

The neutralization of the catalyst is then performed if needed, and alcohol produced by the hydrolysis-condensation reaction is removed under reduced pressure to obtain an aqueous solution of reaction mixture. The amount of acid or alkali used in the neutralization at this time is preferably 0.1 to 2 equivalent weights relative to the acid or alkali used as the catalyst, and the acid or alkali may be any substance as long as the product becomes neutral.

Subsequently, byproducts such as alcohol produced from the reaction mixture by hydrolysis-condensation reaction is preferably removed. The temperature of heating the reaction mixture at this time depends on the type of alcohol produced by a reaction with an added organic solvent, and is preferably 0 to 200° C., more preferably 10 to 150° C., further preferably 15 to 150° C. The degree of reduced pressure at this time depends on the types of organic solvent and alcohol to be removed, an exhaust device, a condenser, and a heating temperature, and is preferably equal to or less than atmospheric pressure, more preferably an absolute pressure of 80 kPa or less, further preferably an absolute pressure of 50 kPa or less. It is difficult to surely know the amount of alcohol to be removed at this time, but it is desirable that about 80% by mass or more of produced alcohol is removed.

Preferable examples of final solvent to be added to a titanium-containing compound solution include butanediol monomethyl ether, propylenegylcol monomethyl ether, ethylenegylcol monomethyl ether, butanediol monoethyl ether, propylenegylcol monoethyl ether, ethylenegylcol monoethyl ether, butanediol monopropyl ether, propylenegylcol monopropyl ether, ethylenegylcol monopropyl ether, ethylenegylcol monobutyl ether, diethylenegylcol monomethyl ether, diethylene glycol monoethyl ether, diethylenegylcol monopropyl ether, diethylene glycol monobutyl ether, propylenegylcol monobutyl ether, 1-butanol, 2-butanol, 2-methyl-1-propanol, 4-methyl-2-pentanol, acetone, tetrahydrofuran, toluene, hexane, ethyl acetate, cyclohexanone, methyl amyl ketone, propylenegylcol dimethyl ether, diethylene glycol dimethyl ether, diamyl ether, propylenegylcol monomethyl ether acetate, propylenegylcol monoethyl ether acetate, ethyl pilvate, butyl acetate, methyl 3-methoxypropionate, ethyl 3-ethoxypropionate, tert-butyl acetate, tert-butyl propionate, propylenegylcol mono-tert-butyl ether acetate, γ-butyrolactone, methyl isobutyl ketone, and cyclopentyl methyl ether.

The molecular weight of titanium-containing compound to be obtained can be adjusted by selection of titanium-containing compound and control of reaction condition in hydrolysis condensation. A titanium-containing compound having a weight average molecular weight of 100,000 or less, preferably 200 to 50,000, more preferably 300 to 30,000 is preferably used since a foreign matter and uneven coating are not caused. Data involved in the weight average molecular weight are represented by molecular weight in terms of polystyrene, measured using polystyrenes as a standard substance by gel permeation chromatography (GPC) using RI as a detector and tetrahydrofuran as an eluting solvent.

It is preferable that the composition for forming a titanium-containing resist underlayer film further contain a component (B).

Examples of starting material for such a component (B) include a silicon-containing compound obtained by hydrolysis and/or condensation of one or more kinds of silicon compounds represented by the following general formula (B-I):

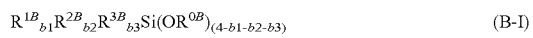

$$R^{1B}_{b1}R^{2B}_{b2}R^{3B}_{b3}Si(OR^{OB})_{(4-b1-b2-b3)}$$ (B-I)

wherein, $R^{OB}$ represents a hydrocarbon group having 1 to 6 carbon atoms; $R^{1B}$, $R^{2B}$ and $R^{3B}$ represent a hydrogen atom or a monovalent organic group having 1 to 30 carbon atoms; and b1, b2, and b3 are 0 or 1, and satisfy $1 \leq b1+b2+b3 \leq 3$.

Examples of the silicon compound represented by the general formula (B-1) may be as follows:

trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyitripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, tert-butyltrimethoxysilane, tert-butyltriethoxysilane, tert-butyltripropoxysilane, tert-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienyipropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, tolyltrimethoxysilane, tolyltriethoxysilane, tolyltripropoxysilane, tolyltriisopropoxysilane, anisyltrimethoxysilane, anisyltriethoxysilane, anisyltripropoxysilane, anisyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-tert-butyldimethoxysilane, di-tert-butyldiethoxysilane, di-tert-butyldipropoxysilane, di-tert-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)

diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenetylmethoxysilane, and dimethylphenetylethoxysilane.

In addition, as the silicon compound represented by the general formula (B-1), a compound having two or three methoxy groups, ethoxy groups, propoxy groups, butoxy groups, pentoxy groups, cyclopentoxy groups, hexyloxy groups, cyclohexyloxy groups, or phenoxy groups as a hydrolysable group on silicon of the following structures can be used.

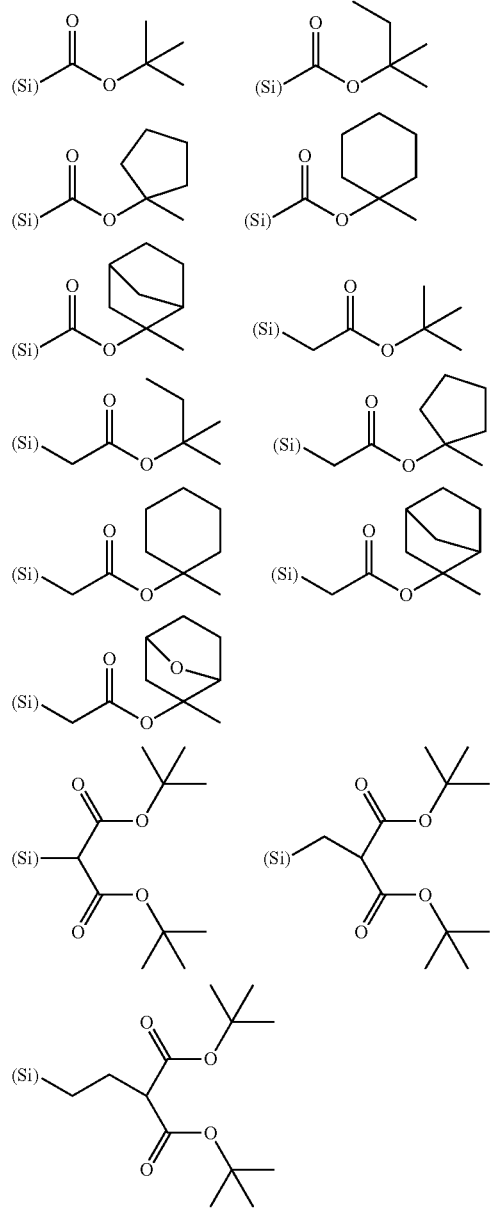

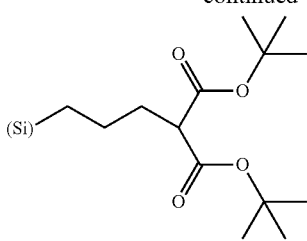

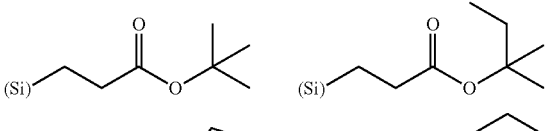

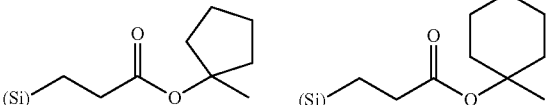

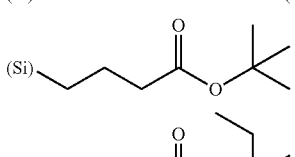

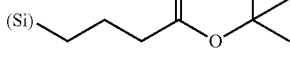

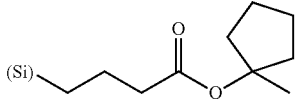

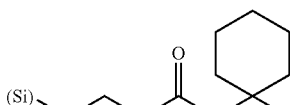

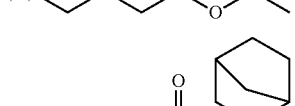

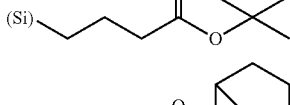

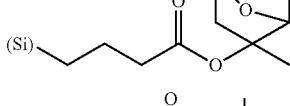

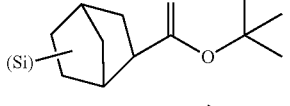

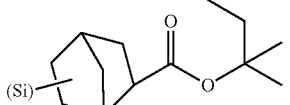

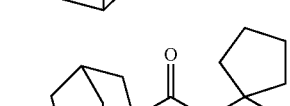

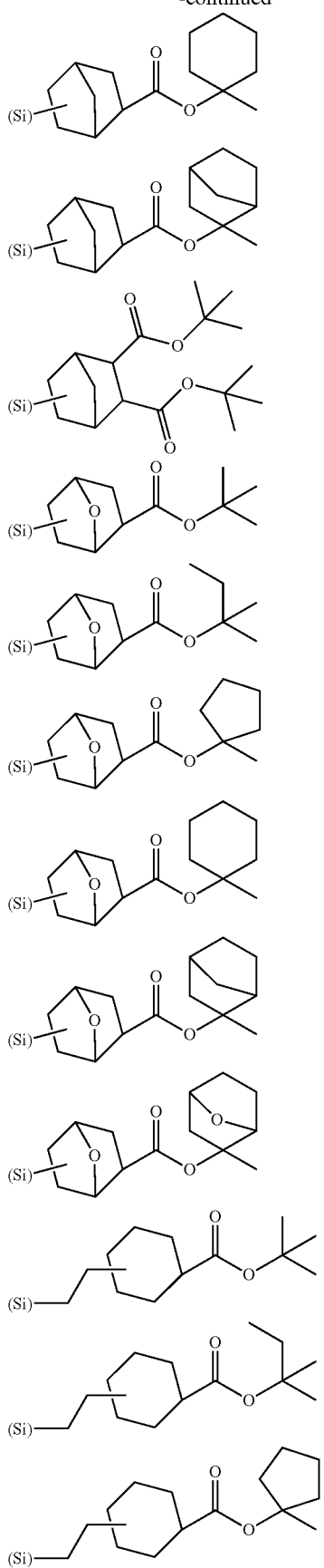
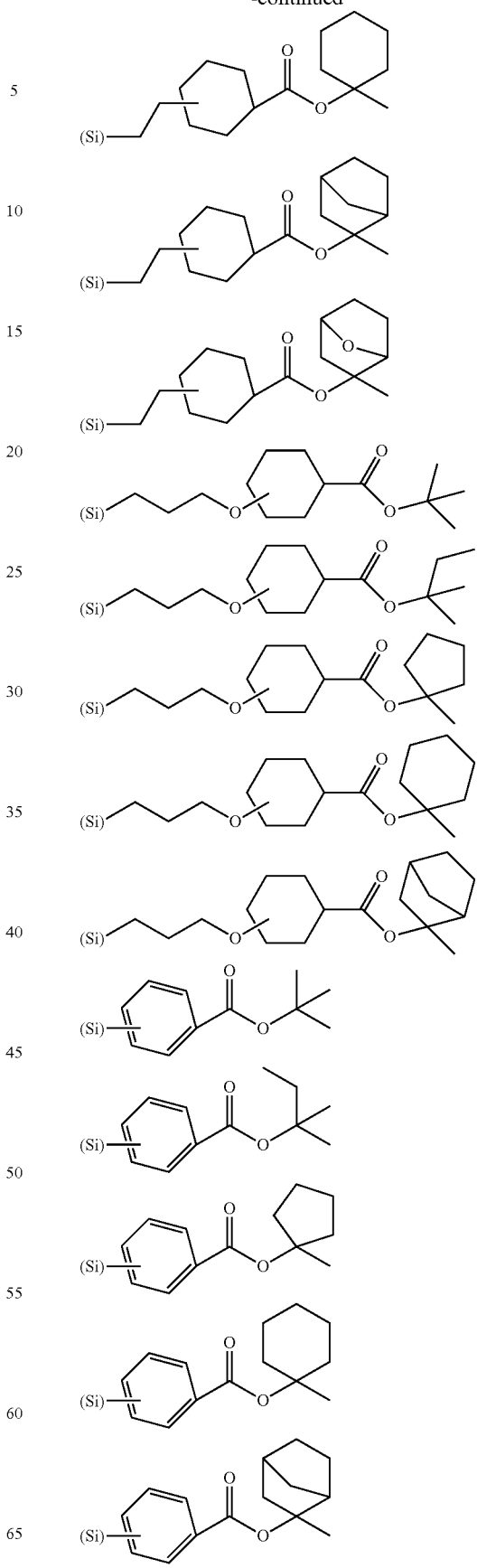

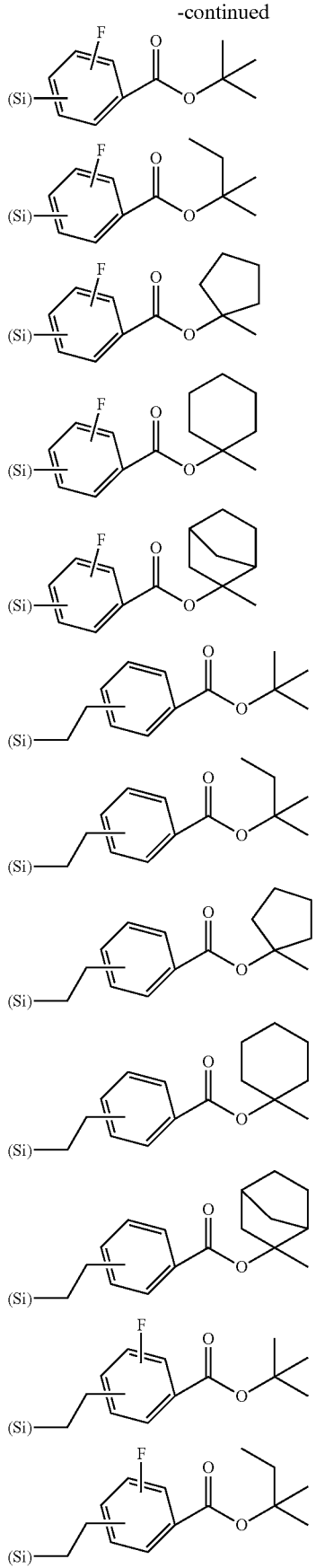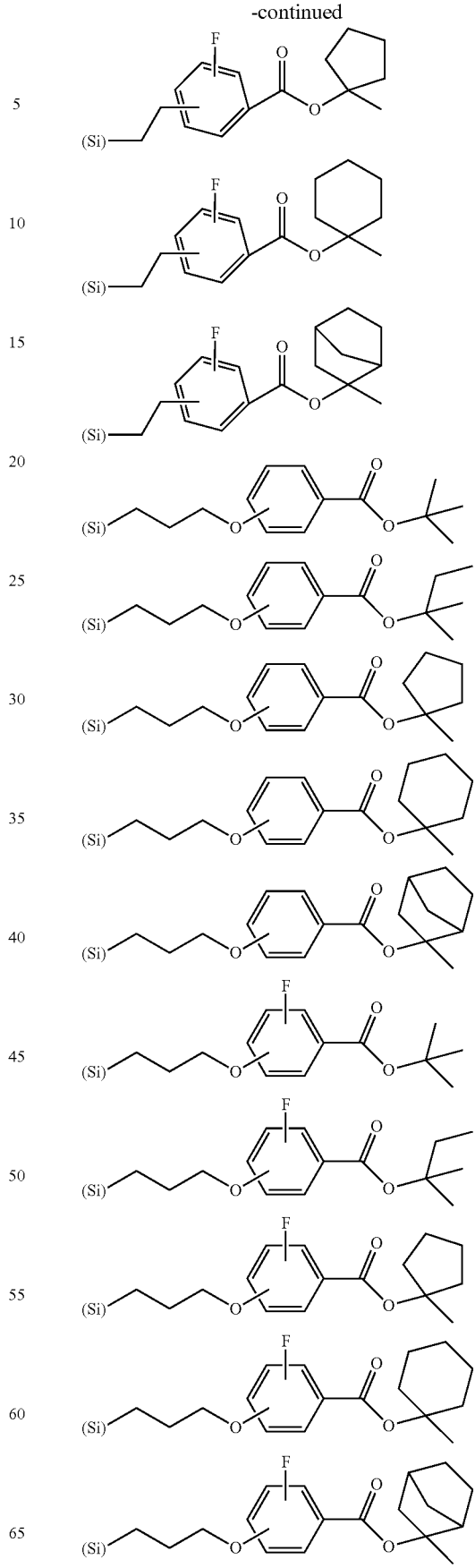

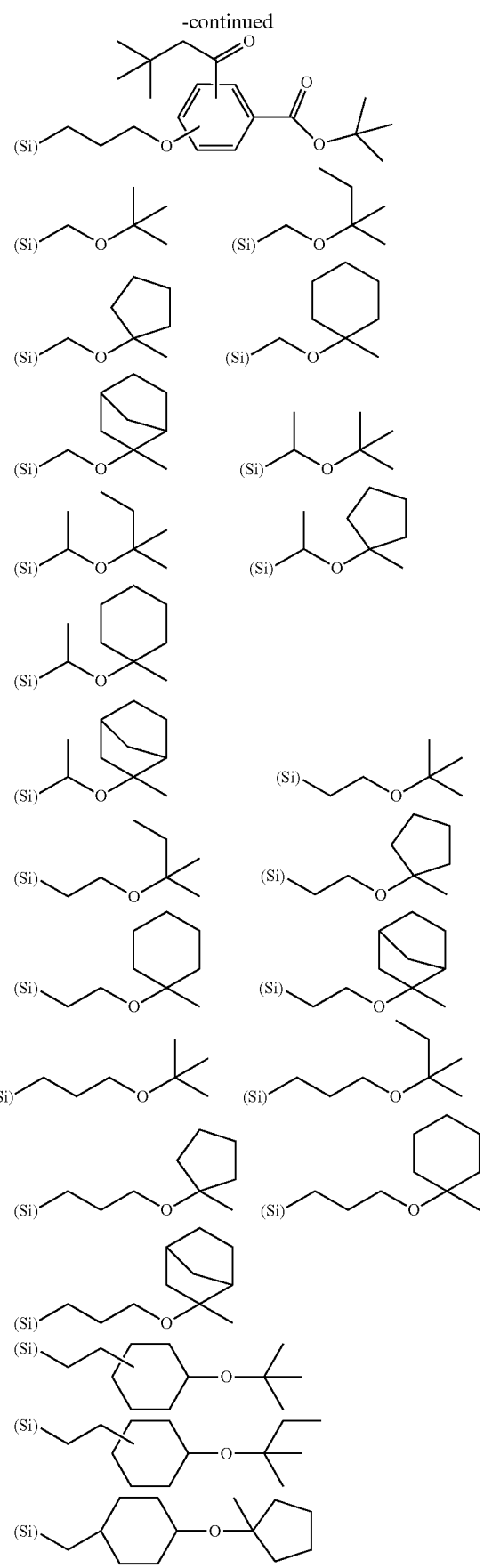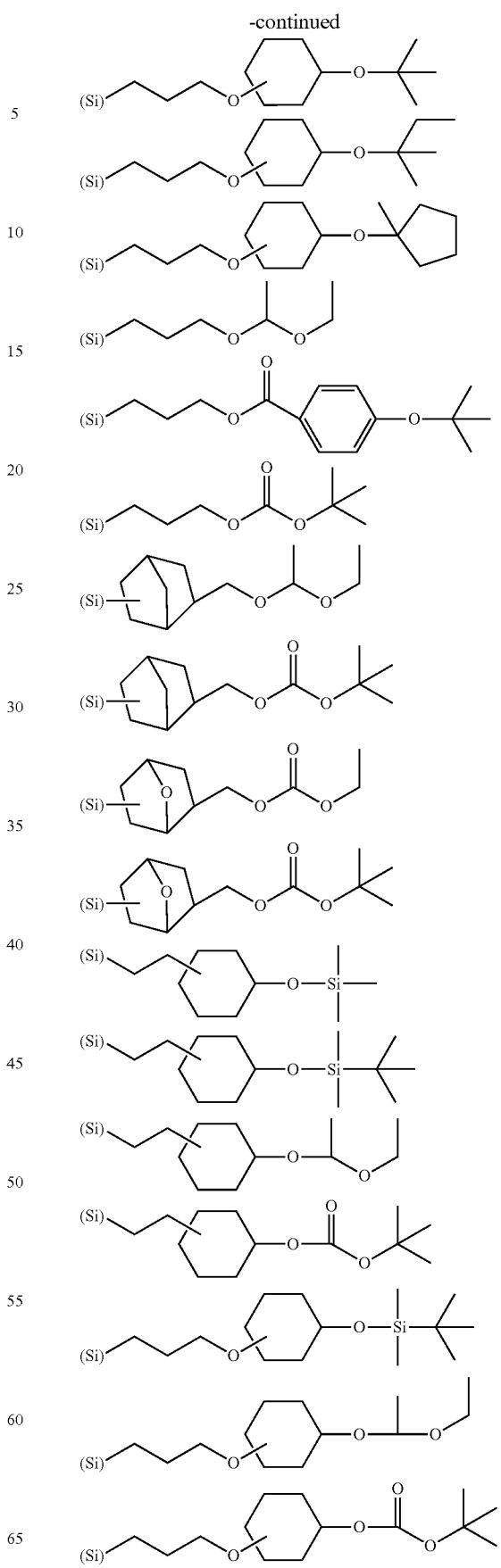

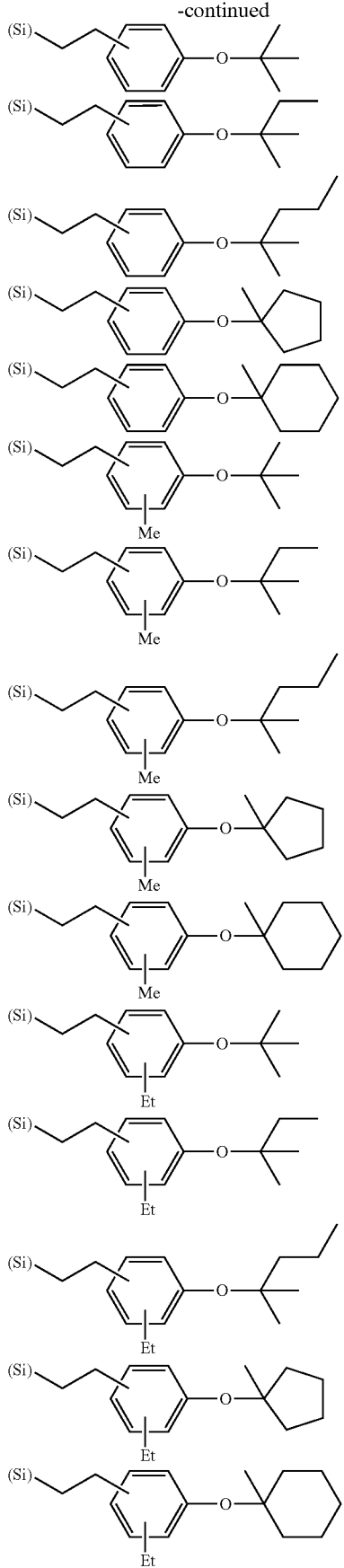
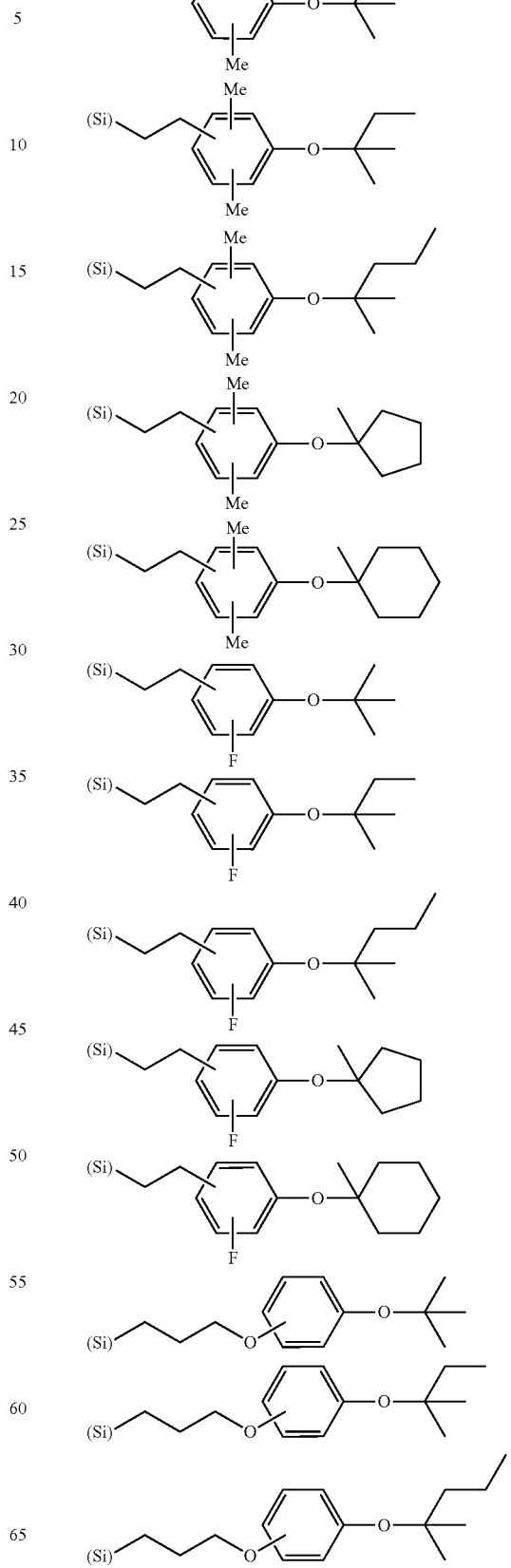

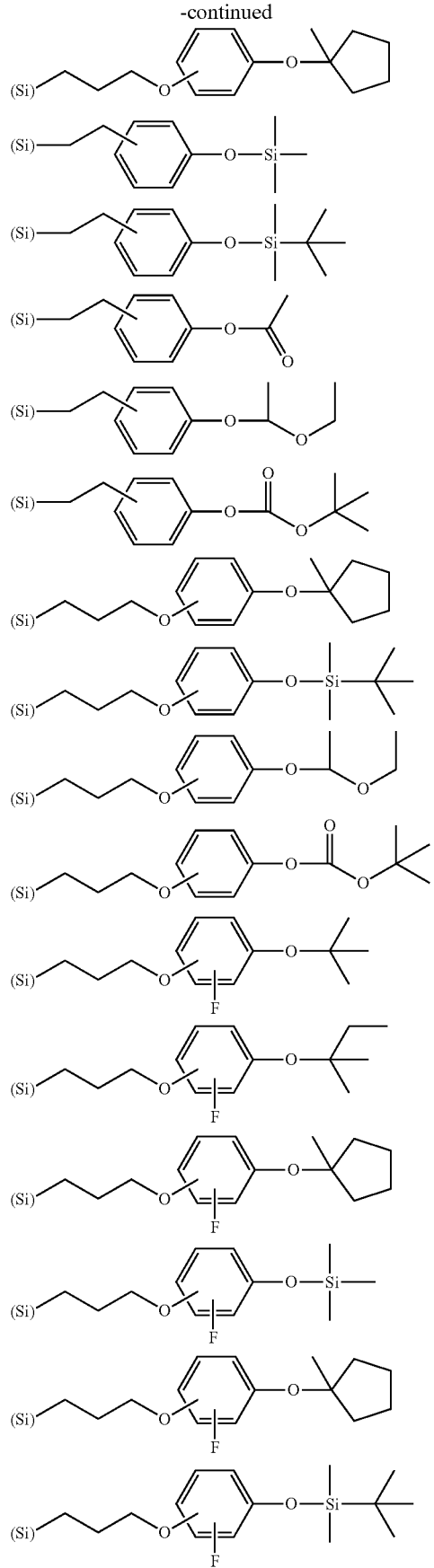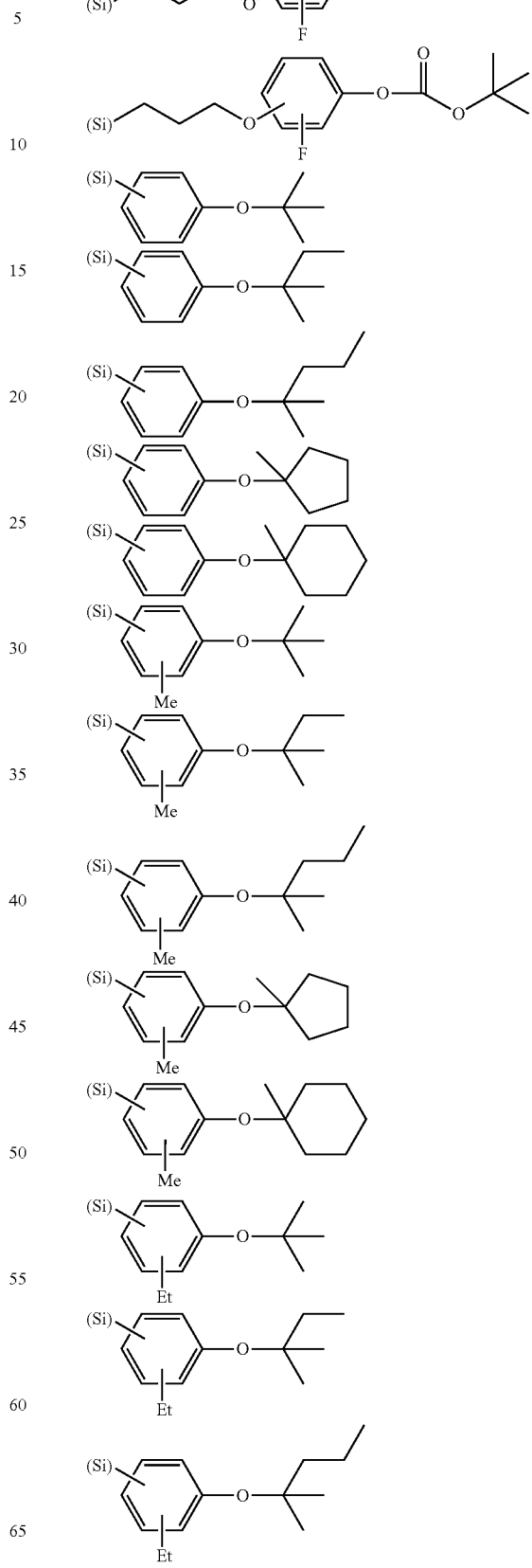

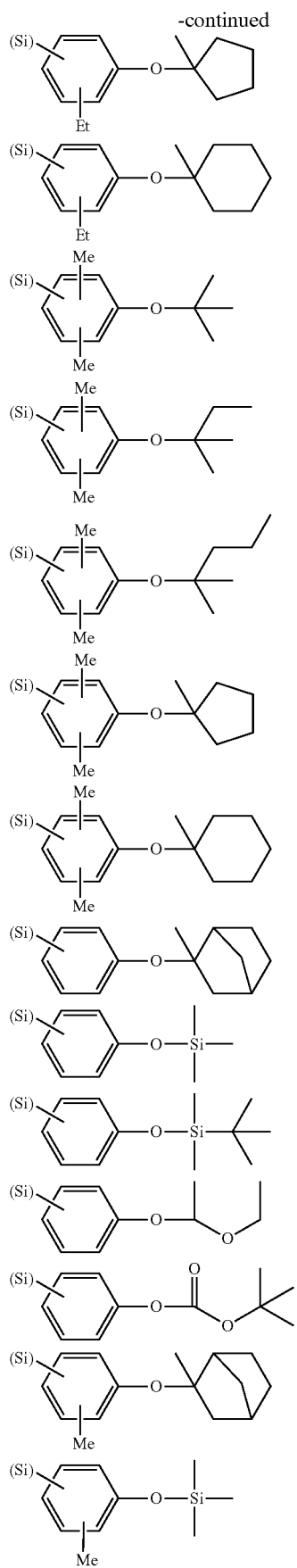
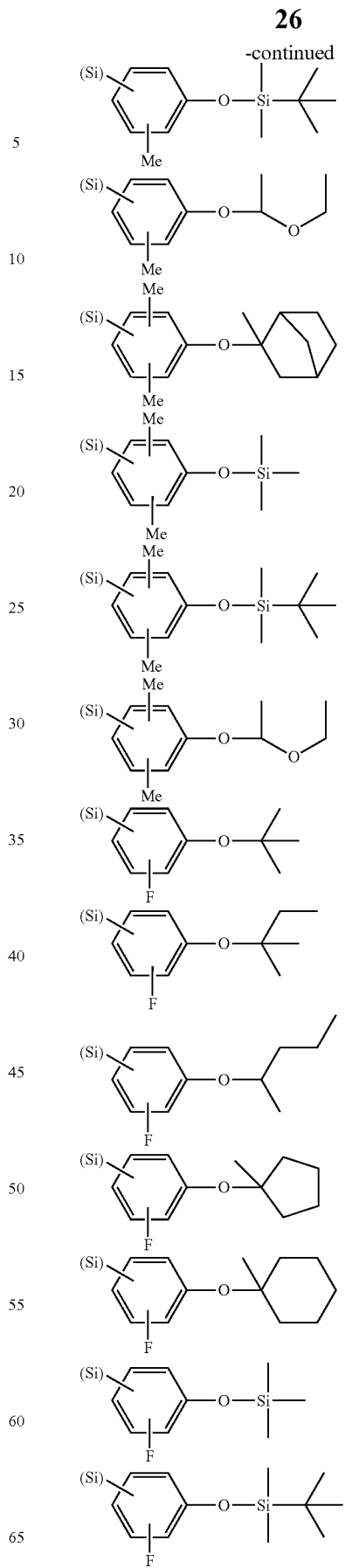

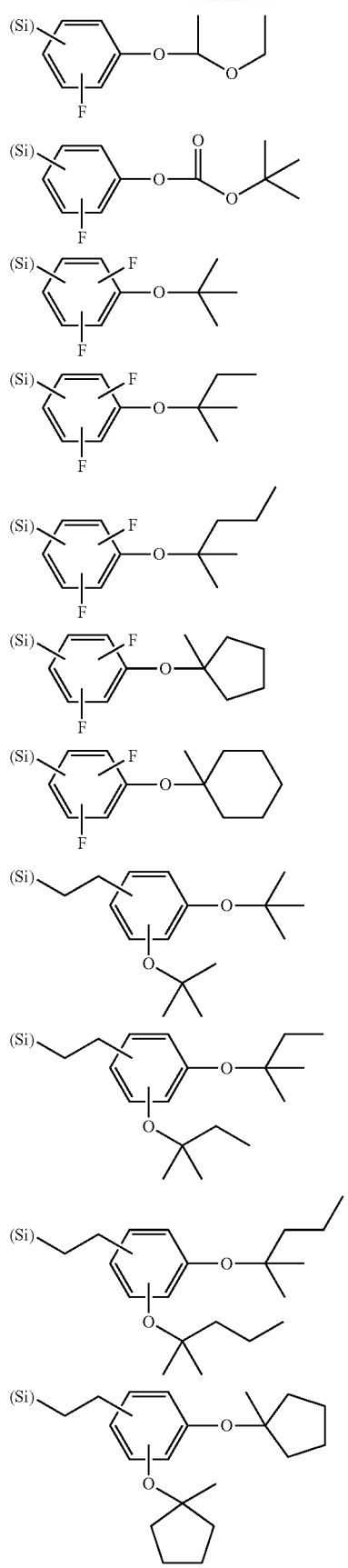
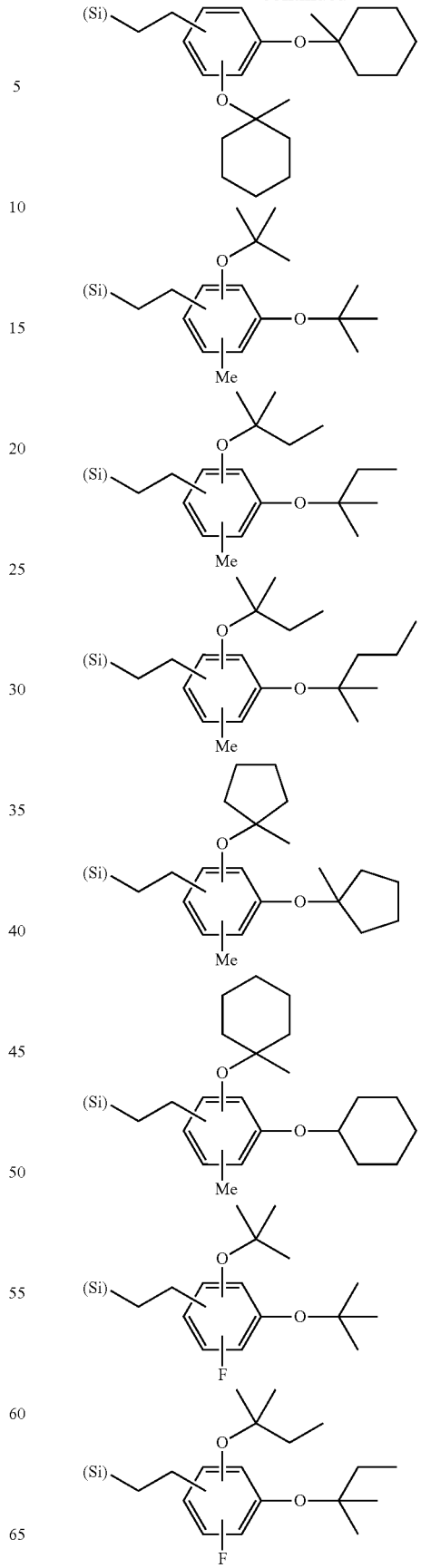

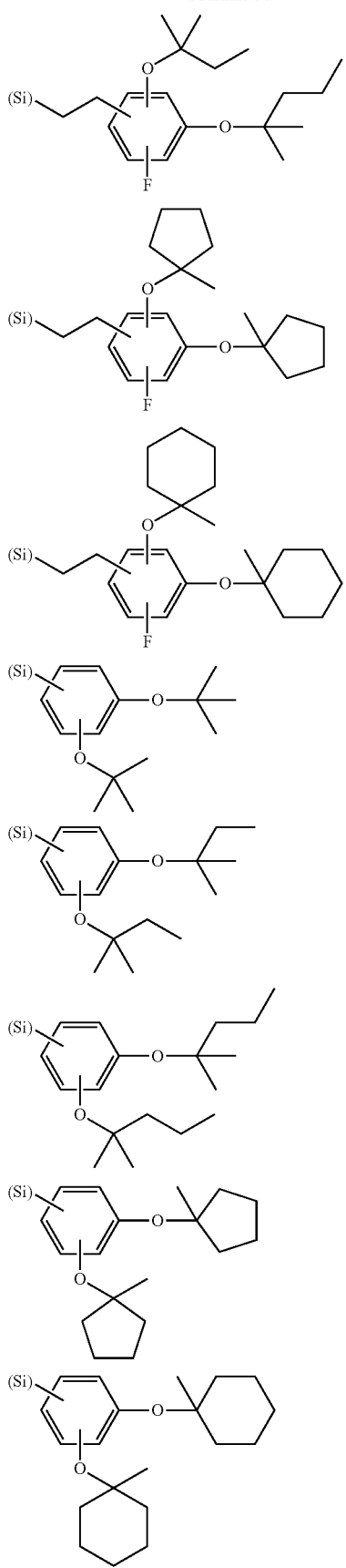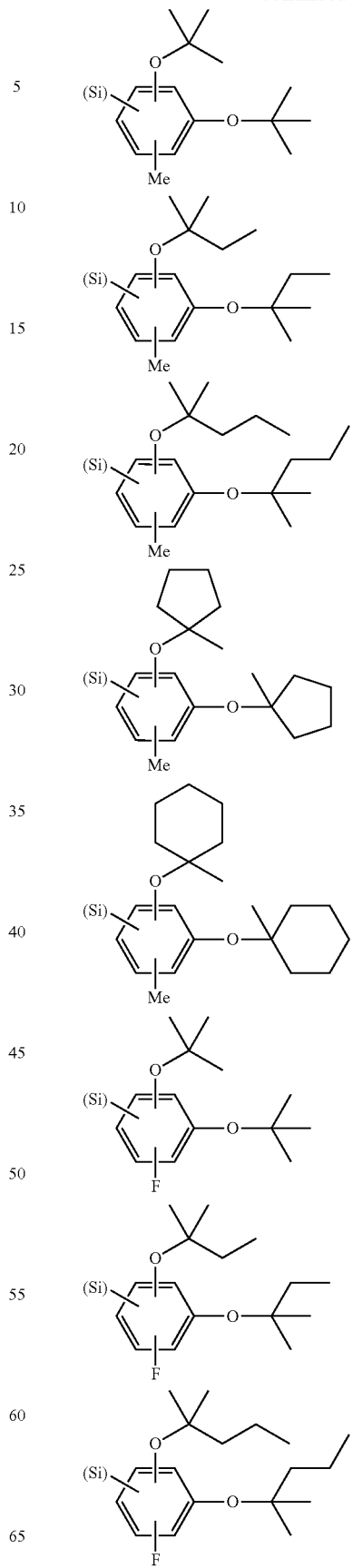

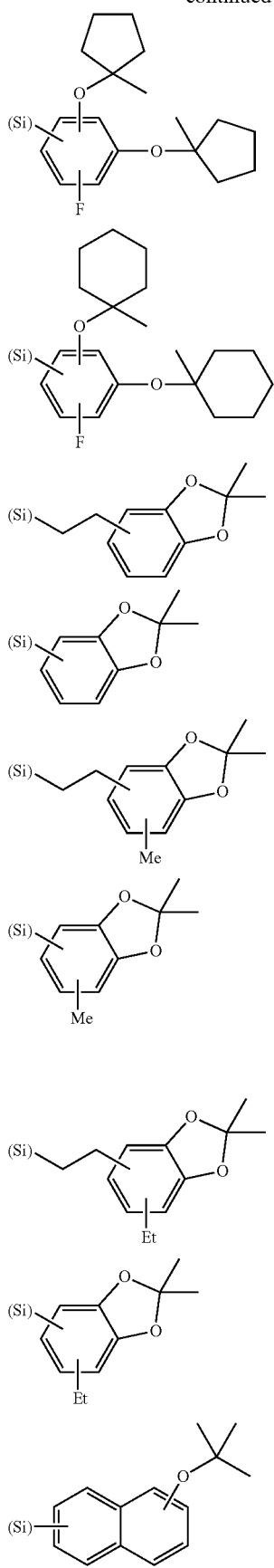

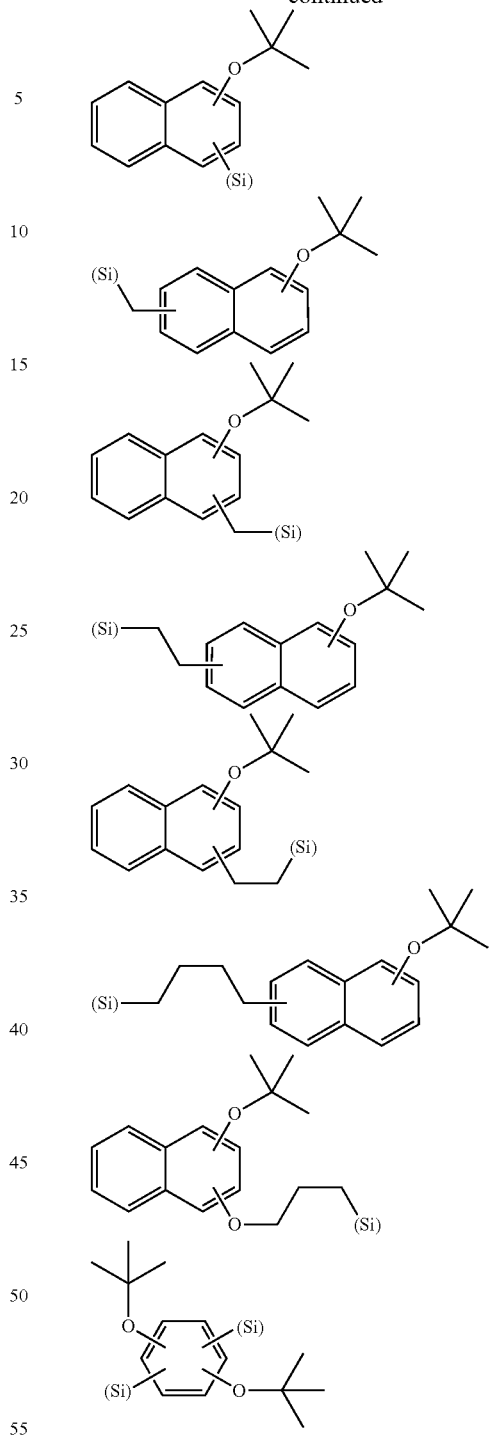

Examples of other starting material for the component (B) include a silicon-containing compound obtained by hydrolysis and/or condensation of one or more kinds of silicon compounds represented by the following general formula (B-II):

$$Si(OR^{4B})_4 \quad \text{(B-II)}$$

wherein, $R^{4B}$ represents a hydrocarbon group having 1 to 6 carbon atoms.

Examples of silicon compound represented by the general formula (B-II) include tetramethoxysilane, tetraethoxysilane, tetrapropoxysilane, and tetraisopropoxysilane.

One or more kinds of the silicon compounds can be selected and hydrolyzed and condensed in the presence of an acid catalyst or a base catalyst to prepare a silicon-containing compound contained in the component (B).

At this time, as the used acid catalyst, one or more compounds selected from an inorganic acid, an aliphatic sulfonic acid, an aromatic sulfonic acid, an aliphatic carboxylic acid, and an aromatic carboxylic acid can be used. Specific examples thereof include hydrofluoric acid, hydrochloric acid, hydrobromic acid, sulfuric acid, nitric acid, perchloric acid, phosphoric acid, methanesulfonic acid, benzenesulfonic acid, toluene sulfonic acid, formic acid, acetic acid, propionic acid, oxalic acid, malonic acid, maleic acid, fumaric acid, and benzoic acid.

Examples of the used base catalyst include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide.

The amount of each catalyst to be used is $10^{-6}$ to 10 moles, preferably $10^{-5}$ to 5 moles, more preferably $10^{-4}$ to 1 moles, relative to 1 mole of monomer.

The amount of water to be added when the silicon-containing compound is obtained from the monomer by hydrolysis-condensation is preferably 0.01 to 100 moles, more preferably 0.05 to 50 moles, further preferably 0.1 to 30 moles, relative to 1 mole of hydrolyzable substituent bonded to the monomer. When the amount of the water to be added is 100 moles or less, a device used in the reaction needs not to be huge, and therefore it is economic and preferable.

As the operation procedure when the silicon-containing compound is obtained from the monomer by hydrolysis-condensation, methods described in Japanese Patent Laid-Open Publication No. 2009-126940, paragraphs [0103] to [0120], and [0142] to [0156] can be exemplified.

The molecular weight of silicon-containing compound to be obtained can be adjusted by selection of monomer and control of reaction condition in polymerization. When a silicon-containing compound having a weight average molecular weight more than 100,000 is used, a foreign matter and uneven coating may be caused. A silicon-containing compound having a weight average molecular weight of 100,000 or less, more preferably 200 to 50,000, further preferably 300 to 30,000 is preferably used. Data involved in the weight average molecular weight are represented by molecular weight in terms of polystyrene, measured using polystyrenes as a standard substance by gel permeation chromatography (GPC) using RI as a detector and tetrahydrofuran as an eluting solvent.

The composition for forming a titanium-containing resist underlayer film may further contain a photoacid generator. Specifically, a substance described in Japanese Patent Laid-Open Publication No. 2009-126940, paragraphs [0160] to [0179] can be added as a photoacid generator to be used.

The composition for forming a titanium-containing resist underlayer film may further contain a thermal acid generator. Specifically, a substance described in Japanese Patent Laid-Open Publication No. 2007-199653, paragraphs [0061] to [0085] can be added as a thermal acid generator to be used.

The composition for forming a titanium-containing resist underlayer film can further contain a surfactant, if necessary. Specifically, a substance described in Japanese Patent Laid-Open Publication No. 2009-126940, paragraph [0129], can be blended as such a surfactant.

The composition for forming a titanium-containing resist underlayer film is used to form the titanium-containing resist underlayer film 4 on the organic hard mask 3 or the organic hard mask (not shown) formed in the step (1). The titanium content in the titanium-containing resist underlayer film is 10 to 60% by mass. When the titanium content is less than 10% by mass, a residue is not removed to remain in a removing step of the wet stripping method described later. A titanium content more than 60% by mass is impossible in theory.

Such a titanium-containing resist underlayer film can be formed on an organic underlayer film or an organic hard mask from the composition for forming a titanium-containing resist under layer film by the spin-coating method. After spin-coating, it is desirable that a crosslinking reaction is promoted by evaporating a solvent and baking the film to prevent mixing with a photoresist film. The baking temperature within a range of 50 to 500° C. is preferably used for 10 to 300 seconds. The temperature range depends on the structure of device to produced, but is particularly preferably 400° C. or lower since the thermal damage against the device is reduced.

In the step (3), the photoresist film 5 is formed by using a chemically amplified resist composition on the titanium-containing resist underlayer film 4 (FIG. 1(IV-a)).

The chemically amplified resist composition forming the photoresist film 5 is not particularly limited, and preferably contains a resin having a repeating unit represented by the following general formula (a1):

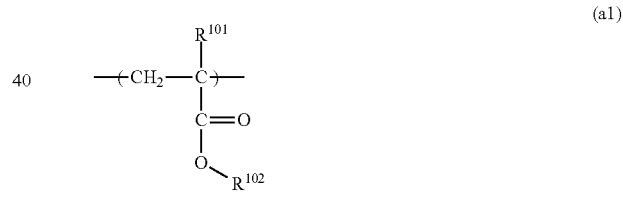

wherein, $R^{101}$ represents a hydrogen atom or a methyl group, and $R^{102}$ represents an acid labile group.

A monomer to obtain the repeating unit having an acid labile group represented by the general formula (a1) is represented by the following general formula (Ma1), wherein $R^{101}$ and $R^{102}$ represent the same meaning as before.

Substances described in Japanese Patent Laid-Open Publication No. 2008-111103, paragraphs [0083] to [0104], specifically [0114] to [0117] can be used as the monomer.

A chemically amplified resist composition used in the patterning process of the present invention preferably contains an acid generator, and examples thereof include a compound generating an acid in respond to active light beam or radiation (photoacid generator). The component of a photoacid generator may be a compound generating an acid under high energy irradiation. Suitable examples of photoacid generator include sulfonium salt, iodonium salt, sulfonyldiazomethane, N-sulfonyloxyimide, and oxime-O-sulfonate acid generators. These may be used alone or as a mixture of two or more kinds. Specific examples of acid generators may include those described in Japanese Patent Laid-Open Publication No. 2008-111103, paragraphs [0122] to [0142].

A photoresist film 5 is formed on the titanium-containing resist underlayer film 4 formed in the step (2) using the chemically amplified resist composition. Such a photoresist film can be formed, for example, by a spin-coating method, or the like.

In the step (4), after heat-treatment, the photoresist pattern 5a (positive photoresist pattern 5a) is formed by exposing the photoresist film 5 to high energy beam and developing (FIGS. 1(V-a) and (VI-a)).

It is preferable that the photoresist film be exposed to high energy beam by the method of photolithography with a wavelength of 300 nm or less or a EUV beam or by the method of a direct drawing with an electron beam. When the lithography with a light having a wavelength of 300 nm or less or a EUV beam is thus performed, a finer pattern can be formed on a body to be processed. In particular, when the photolithography with a EUV beam is performed, a 32-node device can be produced.

The exposed area of exposed photoresist film is dissolved in an alkaline developer to form a positive pattern (FIG. 1, positive photoresist pattern 5a), or the non-exposed area is dissolved in an organic solvent to form a negative pattern (FIG. 1, negative photoresist pattern 5b).

As such an alkaline developer, tetramethylammonium hydroxide (TMAH) or the like can be used.

As a developer of organic solvent, a developer containing as components one or more selected from 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, can be used. From the viewpoints of improved pattern fall, a developer in which the total amount of one or more developer components is 50% by mass or more is preferably used.

In the step (5), the titanium-containing resist underlayer film pattern 4a is formed by pattern-transferring onto the titanium-containing resist underlayer film 4 by using the photoresist pattern 5a as a mask (FIG. 1(VII-a)).

A method for transferring a pattern onto a titanium-containing resist underlayer film is not particularly limited, and may be dry etching using a gas mainly containing fluorine- or fluoride-containing gas such as fluorocarbons. Alternatively, wet etching using a stripper used in the removing step of a wet stripping method described below may be employed.

In the step (6), the organic underlayer film pattern 3a or the organic hard mask pattern (not shown) is formed by pattern-transferring onto the organic underlayer film 3 or the organic hard mask (not shown) by using the titanium-containing resist underlayer film pattern 4a as a mask (FIG. 1(VIII-a)).

The method for transferring a pattern on an organic underlayer film or an organic hard mask is not particularly limited, and may be reactive dry etching by oxygen gas plasma.

In the step (7), the exposed area of the titanium-containing hard mask 2 and the residue 4a' of the titanium-containing resist underlayer film are removed by the wet stripping method (FIG. 1(IX-a)).

In the removing step by the wet stripping method according to the patterning process of the present invention, when the exposed area of the titanium-containing hard mask and the residue of the titanium-containing resist underlayer film are wet stripped, a stripper containing hydrogen peroxide is preferably used. To promote stripping, it is preferable that an acid or an alkali be added to adjust the pH. Examples of a pH adjuster used in this case include an inorganic acid such as hydrochloric acid and sulfuric acid, an organic acid such as acetic acid, oxalic acid, tartaric acid, citric acid, and lactic acid, an alkali containing nitrogen such as ammonia, ethanolamine, or tetramethylammonium hydroxide, and an organic acid compound containing nitrogen such as ethylenediamine tetraacetate (EDTA).

The method for wet stripping includes a method in which a body to be processed having a resist pattern to be processed is immersed into a stripper of preferably 0 to 80° C., more preferably 5 to 60° C. According to such a method, the exposed area of the titanium-containing hard mask and the residue of the titanium-containing resist underlayer film can be simultaneously stripped, and therefore they can be efficiently removed. If necessary, by the ordinary procedure including spraying the stripper on the surface and applying the stripper while the body to be processed is rotated, the stripping rate on the titanium-containing resist underlayer film is faster than that at the exposed area of the titanium-containing hard mask, and therefore the titanium-containing resist underlayer film can be more certainly removed.

According to such a method, the titanium-containing hard mask and the titanium-containing resist underlayer film can be certainly removed with ease without causing damage to the body to be processed to expose a layer to be processed on the body to be processed.

Since the body to be processed having an organic underlayer film pattern or an organic hard mask pattern as formed above has no residue of the titanium-containing resist underlayer film on the organic underlayer film pattern or the organic hard mask pattern, and has an exposed layer to be processed on the body to be processed without damage, the body to be processed can be suitably used for a process for microfabrication, for example, a double patterning process.

EXAMPLES

Hereinafter, the present invention will be specifically described with reference to Synthesis Examples, Examples, and Comparative Examples, but is not limited to the following description. In the following examples, percentages were based on mass, and measurement of molecular weight was based on GPC.

Synthesis of Composition for Forming Titanium-Containing Resist Underlayer Film

Synthesis of Component (A)

Synthesis Example A-1

A mixture of 2.7 g of pure water and 50 g of isopropyl alcohol (IPA) was added dropwise to a mixture of 28.4 g of titanium tetraisopropoxide and 50 g of IPA. After completion of dropwise addition, the mixture was stirred for 3 hours. Then, 11.8 g of 2-(butylamino)ethanol was added, and the mixture was stirred for 17 hours. Further, 30.4 g of 1,2-propanediol was added, and the mixture was refluxed for 2 hours. To the mixture, 150 g of PGMEA was added, and the resulting mixture was concentrated under reduced pressure to obtain 130 g of solution containing 19.9 g of nonvolatile matter as A-1.

Synthesis Example A-2

34.3 g of titanium tetrabutoxide was added dropwise to a mixture of 3.94 g of 36% hydrochloric acid, 34.9 g of pure water, and 54.7 g of PGMEA. After completion of dropwise addition, the mixture was stirred for 1 hour. Of two layers separated, an upper layer was removed. To a remaining lower layer, 54.7 g of PGMEA was added, and the mixture was stirred. Then, an upper layer of two layers separated was removed. To a remaining lower layer, 20.0 g of ethyl acetoacetate was added, and the mixture was stirred and dissolved to obtain 53.4 g of solution. To the solution, 30.4 g of 1,2-propanediol was added, and the mixture was concentrated under reduced pressure. Then, to the mixture, 150 g of PGMEA was added to obtain 168 g of solution containing 12.9 g of nonvolatile matter as A-2.

Synthesis Example A-3

A mixed solution of 110 g of IPA and 2.7 g of pure water was added dropwise to a mixture of 48.6 g of solution of titanium diisopropoxide-bis(2,4-pentanedionate) in 75% IPA and 10 g of 2,4-pentanedione. After completion of dropwise addition, the mixture was stirred for 3 hours. Then, 11.8 g of 2-(butylamino)ethanol was added, and the mixture was stirred for 17 hours. Further, 30.4 g of 1,2-propanediol was added, and the mixture was refluxed for 2 hours. To the mixture, 150 g of PGMEA was added, and the resulting mixture was concentrated under reduced pressure to obtain 141 g of solution containing 23.1 g of nonvolatile matter as A-3.

Synthesis of Component (B)

Synthesis Example B-1

68.1 g of [Monomer 101] was added to a mixture of 200 g of methanol, 0.1 g of methanesulfonic acid, and 60 g of deionized water, and the mixture was held at 40° C. for 12 hours to perform hydrolysis and condensation. After completion of the reaction, 200 g of propylene glycol methyl ether acetate (PGMEA) was added and alcohol as a byproduct was distilled off under reduced pressure. To the residue, 1000 mL of ethyl acetate and 300 g of PGMEA were added to separate an aqueous layer. To the remaining organic layer, 100 mL of ion exchanged water was added, and the mixture was stirred, allowed to stand, and separated. This procedure was repeated three times. The remaining organic layer was concentrated under reduced pressure to obtain 170 g of solution of silicon-containing compound B-1 in PGMEA (compound concentration: 20%). The molecular weight thereof in terms of polystyrene was measured to be Mw=2,200.

Synthesis Examples B-2 through B-6 were performed by using a monomer each shown in Table 1 under the same condition as in Synthesis Example B-1 to obtain each target compound.

TABLE 1

| Synthesis Example | Reaction starting material | Mw |
|---|---|---|
| B-1 | [Monomer 101]: 68.1 g | 2200 |
| B-2 | [Monomer 100]: 29.7 g, [Monomer 101]: 47.7 g | 2400 |
| B-3 | [Monomer 100]: 19.8 g, [Monomer 101]: 27.2 g, [Monomer 102]: 30.4 g | 2500 |
| B-4 | [Monomer 101]: 27.2 g, [Monomer 102]: 22.8 g, [Monomer 103]: 44.8 g | 2400 |
| B-5 | [Monomer 101]: 13.6 g, [Monomer 102]: 38.1 g, [Monomer 104]: 49.0 g | 2300 |
| B-6 | [Monomer 101]: 34.1 g, [Monomer 102]: 15.2 g, [Monomer 105]: 47.5 g | 2800 |

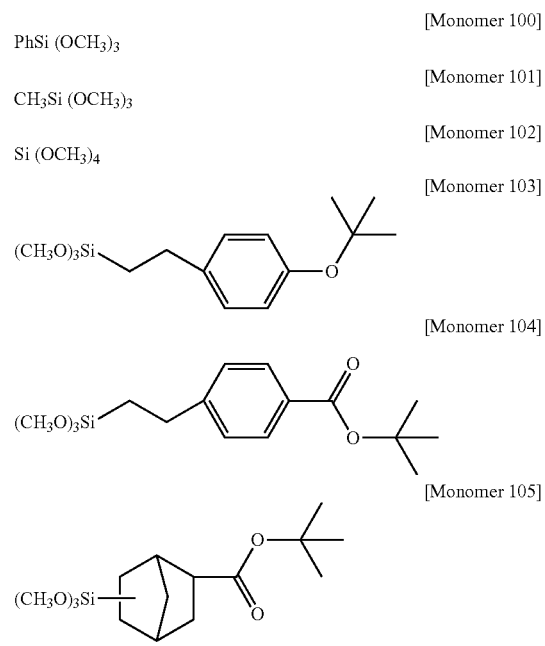

Each component obtained in the synthesis example, a solvent, and an additive were mixed at a ratio shown in Table 2. The mixture was filtrated through a fluororesin filter having a pore size of 0.1 μm, to prepare each composition for forming a titanium-containing resist underlayer film as Sols. 1 to 21. Each of the compositions was baked at a predetermined temperature (180, 250, 350, or 450° C.), the coating film on a wafer was scratched off, and an ashing process was performed at 800° C. From the resultant, $TiO_2$ content and Ti content at the predetermined temperature were determined by calculation. For a sample containing Si, correction in x-ray fluorescence analysis and determination of the amount were performed. The results are shown in Tables 3 and 4.

TABLE 2

| No. | Component (A) Titanium-containing compound (Part by mass) | Component (B) Silicon-containing compound (Part by mass) | Additive (Part by mass) | Solvent (Part by mass) |
|---|---|---|---|---|
| Sol. 1 | A-1 (4.0) | — | — | PGMEA (145) |
| Sol. 2 | A-2 (4.0) | — | — | PGMEA (120) |
| Sol. 3 | A-3 (4.0) | — | — | PGMEA (150) |
| Sol. 4 | A-1 (3.9) | B-1 (0.1) | TPSMA (0.04) | PGMEA (145) |
| Sol. 5 | A-1 (3.9) | B-2 (0.1) | TPSMA (0.04) | PGMEA (145) |

TABLE 2-continued

| No. | Component (A) Titanium-containing compound (Part by mass) | Component (B) Silicon-containing compound (Part by mass) | Additive (Part by mass) | Solvent (Part by mass) |
|---|---|---|---|---|
| Sol. 6 | A-1 (3.9) | B-3 (0.1) | TPSMA (0.04) | PGMEA (145) |
| Sol. 7 | A-1 (3.9) | B-4 (0.1) | TPSMA (0.04) | PGMEA (145) |
| Sol. 8 | A-1 (3.9) | B-5 (0.1) | TPSMA (0.04) | PGMEA (145) |
| Sol. 9 | A-1 (3.9) | B-6 (0.1) | TPSMA (0.04) | PGMEA (145) |
| Sol. 10 | A-2 (3.9) | B-1 (0.1) | TPSMA (0.04) | PGMEA (125) |
| Sol. 11 | A-2 (3.9) | B-2 (0.1) | TPSMA (0.04) | PGMEA (125) |
| Sol. 12 | A-2 (3.9) | B-3 (0.1) | TPSMA (0.04) | PGMEA (125) |
| Sol. 13 | A-2 (3.9) | B-4 (0.1) | TPSMA (0.04) | PGMEA (125) |
| Sol. 14 | A-2 (3.9) | B-5 (0.1) | TPSMA (0.04) | PGMEA (125) |
| Sol. 15 | A-2 (3.9) | B-6 (0.1) | TPSMA (0.04) | PGMEA (125) |
| Sol. 16 | A-1 (3.0) | B-3 (1.0) | TPSMA (0.04) | PGMEA (145) |
| Sol. 17 | A-1 (2.5) | B-3 (1.5) | TPSMA (0.04) | PGMEA (145) |
| Sol. 18 | A-1 (2.0) | B-3 (2.0) | TPSMA (0.04) | PGMEA (145) |
| Sol. 19 | A-1 (1.5) | B-3 (2.5) | TPSMA (0.04) | PGMEA (145) |
| Sol. 20 | A-1 (1.0) | B-3 (3.0) | TPSMA (0.04) | PGMEA (145) |
| Sol. 21 | A-1 (0.5) | B-3 (3.5) | TPSMA (0.04) | PGMEA (145) |

TPSMA: mono(triphenylsulfonium)maleate

TABLE 3

| No. | Baking temperature (° C.) | Amount before ashing (mg) | Amount after ashing (mg) | $TiO_2$ content (% by mass) | Ti content (% by mass) |
|---|---|---|---|---|---|
| Sol. 1 | 180 | 4.34 | 1.94 | 44.7 | 26.8 |
|  | 250 | 4.52 | 3.09 | 68.4 | 41.0 |
|  | 350 | 4.80 | 3.72 | 77.6 | 46.5 |
|  | 450 | 4.68 | 4.55 | 97.2 | 58.2 |
| Sol. 2 | 180 | 4.92 | 2.08 | 42.2 | 25.3 |
|  | 250 | 4.38 | 3.10 | 70.8 | 42.4 |
|  | 350 | 4.81 | 3.65 | 75.8 | 45.5 |
|  | 450 | 4.61 | 4.44 | 96.2 | 57.7 |
| Sol. 3 | 180 | 4.71 | 2.18 | 46.2 | 27.7 |
|  | 250 | 4.37 | 2.92 | 66.8 | 40.1 |
|  | 350 | 4.09 | 3.12 | 76.2 | 45.7 |
|  | 450 | 4.84 | 4.46 | 92.2 | 55.3 |
| Sol. 4 | 180 | 4.47 | 1.95 | 42.1 | 25.2 |
|  | 250 | 4.09 | 2.83 | 66.9 | 40.1 |
|  | 350 | 4.19 | 3.19 | 73.5 | 44.0 |
|  | 450 | 4.74 | 4.60 | 93.7 | 56.1 |
| Sol. 5 | 180 | 4.85 | 2.11 | 43.5 | 25.2 |
|  | 250 | 4.76 | 3.40 | 71.4 | 41.4 |
|  | 350 | 4.25 | 3.22 | 73.2 | 43.9 |
|  | 450 | 4.61 | 4.47 | 93.5 | 56.1 |
| Sol. 6 | 180 | 4.69 | 2.14 | 44.1 | 26.5 |
|  | 250 | 4.03 | 2.87 | 68.8 | 41.3 |
|  | 350 | 4.21 | 3.38 | 77.6 | 46.5 |
|  | 450 | 4.86 | 4.66 | 92.5 | 55.4 |
| Sol. 7 | 180 | 4.27 | 2.04 | 46.2 | 27.7 |
|  | 250 | 4.97 | 3.37 | 65.4 | 39.2 |
|  | 350 | 4.55 | 3.59 | 76.2 | 45.7 |
|  | 450 | 4.94 | 4.85 | 94.7 | 56.8 |
| Sol. 8 | 180 | 4.47 | 1.91 | 41.3 | 24.8 |
|  | 250 | 4.46 | 3.23 | 69.8 | 41.8 |
|  | 350 | 4.67 | 3.51 | 72.5 | 43.5 |
|  | 450 | 4.79 | 4.59 | 92.5 | 55.5 |
| Sol. 9 | 180 | 4.90 | 2.16 | 42.5 | 25.4 |
|  | 250 | 4.49 | 3.00 | 64.5 | 38.6 |
|  | 350 | 4.35 | 3.52 | 78.2 | 46.9 |
|  | 450 | 4.68 | 4.33 | 89.3 | 53.5 |
| Sol. 10 | 180 | 4.85 | 2.03 | 40.5 | 24.3 |
|  | 250 | 4.36 | 3.03 | 67.0 | 40.2 |
|  | 350 | 4.39 | 3.34 | 73.5 | 44.1 |
|  | 450 | 4.07 | 3.87 | 91.8 | 55.0 |
| Sol. 11 | 180 | 4.37 | 2.11 | 46.5 | 27.9 |
|  | 250 | 4.74 | 3.44 | 70.1 | 42.0 |
|  | 350 | 4.48 | 3.50 | 75.4 | 45.2 |
|  | 450 | 4.92 | 4.83 | 94.8 | 56.8 |

TABLE 4

| No. | Baking temperature (° C.) | Amount before ashing (mg) | Amount after ashing (mg) | $TiO_2$ content (% by mass) | Ti content (% by mass) |
|---|---|---|---|---|---|
| Sol. 12 | 180 | 4.38 | 1.86 | 41.0 | 24.6 |
|  | 250 | 4.83 | 3.32 | 66.4 | 39.8 |
|  | 350 | 4.98 | 3.97 | 76.9 | 46.1 |
|  | 450 | 4.55 | 4.34 | 92.2 | 55.2 |
| Sol. 13 | 180 | 4.49 | 1.94 | 41.7 | 25.0 |
|  | 250 | 4.35 | 3.01 | 66.7 | 40.0 |
|  | 350 | 4.43 | 3.56 | 77.6 | 46.5 |
|  | 450 | 4.66 | 4.54 | 94.0 | 56.3 |
| Sol. 14 | 180 | 4.24 | 1.92 | 43.6 | 26.2 |
|  | 250 | 4.49 | 3.14 | 67.6 | 40.5 |
|  | 350 | 4.62 | 3.68 | 76.8 | 46.0 |
|  | 450 | 4.11 | 3.78 | 88.8 | 53.2 |
| Sol. 15 | 180 | 4.70 | 2.15 | 44.2 | 26.5 |
|  | 250 | 4.69 | 3.38 | 69.6 | 41.7 |
|  | 350 | 4.02 | 3.04 | 73.0 | 43.7 |
|  | 450 | 4.05 | 3.98 | 94.8 | 56.8 |
| Sol. 16 | 180 | 4.88 | 2.27 | 34.5 | 20.7 |
|  | 250 | 4.47 | 3.04 | 50.5 | 30.3 |
|  | 350 | 4.06 | 3.28 | 59.9 | 35.9 |
|  | 450 | 4.44 | 4.13 | 69.1 | 41.4 |
| Sol. 17 | 180 | 4.47 | 1.94 | 26.9 | 16.1 |
|  | 250 | 4.46 | 3.12 | 43.3 | 26.0 |
|  | 350 | 4.79 | 3.82 | 49.4 | 29.6 |
|  | 450 | 4.99 | 4.86 | 60.3 | 36.2 |
| Sol. 18 | 180 | 4.06 | 1.90 | 23.2 | 13.9 |
|  | 250 | 4.50 | 3.11 | 34.3 | 20.5 |
|  | 350 | 4.83 | 3.76 | 38.5 | 23.1 |
|  | 450 | 4.40 | 4.10 | 46.2 | 27.7 |
| Sol. 19 | 180 | 4.11 | 1.97 | 17.8 | 10.7 |
|  | 250 | 4.77 | 3.46 | 27 0 | 16.2 |
|  | 350 | 4.14 | 3.17 | 28.4 | 17.0 |
|  | 450 | 4.97 | 4.82 | 36_0 | 21.6 |
| Sol. 20 | 180 | 4.58 | 2.14 | 11.6 | 6.9 |
|  | 250 | 4.88 | 2.44 | 12.5 | 7.5 |
|  | 350 | 4.36 | 2.53 | 14.5 | 8.7 |
|  | 450 | 4.80 | 3.17 | 16.5 | 9.9 |
| Sol. 21 | 180 | 4.98 | 2.24 | 5.6 | 3.3 |
|  | 250 | 4.64 | 3.12 | 8.3 | 5.0 |
|  | 350 | 4.04 | 3.28 | 10.0 | 6.0 |
|  | 450 | 4.03 | 3.85 | 11.8 | 7.1 |

$TiO_2$ content (% by mass)=(amount after ashing)/(amount before ashing)×100

Ti content in $TiO_2$ (% by mass)=47.87/79.87×$TiO_2$ content (% by mass)

Wet Etching Test of Coating Film

A silicon wafer was spin-coated with each of compositions for forming a titanium-containing resist underlayer film Sols. 1 to 21, and heated at 180, 250, 350, or 450° C. for 1 minute to form a titanium-containing resist underlayer film having a film thickness of 35 nm. The film was immersed in 1% hydrogen peroxide containing 0.6% ammonia (hereinafter referred to as ammonia-hydrogen peroxide) at 23° C. for 10 minutes, and the thickness of remaining film was measured with M-2000 high-speed spectroscopic Ellipsometer manufactured by J.A. Woollam Co., Inc. The results are shown in Table 5.

TABLE 5

| No. | Baking temperature (° C.) | Film thickness before process (A) | Film thickness after process (A) |
|---|---|---|---|
| Sol. 1 | 180 | 341 | 2 or less |
|  | 250 | 341 | 2 or less |
|  | 350 | 354 | 2 or less |
|  | 450 | 345 | 2 or less |

TABLE 5-continued

| No. | Baking temperature (° C.) | Film thickness before process (A) | Film thickness after process (A) |
|---|---|---|---|
| Sol. 2 | 180 | 351 | 2 or less |
| | 250 | 360 | 2 or less |
| | 350 | 353 | 2 or less |
| | 450 | 357 | 2 or less |
| Sol. 3 | 180 | 359 | 2 or less |
| | 250 | 341 | 2 or less |
| | 350 | 351 | 2 or less |
| | 450 | 355 | 2 or less |
| Sol. 4 | 180 | 345 | 2 or less |
| | 250 | 355 | 2 or less |
| | 350 | 350 | 2 or less |
| | 450 | 348 | 2 or less |
| Sol. 5 | 180 | 340 | 2 or less |
| | 250 | 346 | 2 or less |
| | 350 | 358 | 2 or less |
| | 450 | 358 | 2 or less |
| Sol. 6 | 180 | 342 | 2 or less |
| | 250 | 342 | 2 or less |
| | 350 | 360 | 2 or less |
| | 450 | 359 | 2 or less |
| Sol. 7 | 180 | 357 | 2 or less |
| | 250 | 357 | 2 or less |
| | 350 | 345 | 2 or less |
| | 450 | 359 | 2 or less |
| Sol. 8 | 180 | 349 | 2 or less |
| | 250 | 345 | 2 or less |
| | 350 | 355 | 2 or less |
| | 450 | 351 | 2 or less |
| Sol. 9 | 180 | 344 | 2 or less |
| | 250 | 348 | 2 or less |
| | 350 | 343 | 2 or less |
| | 450 | 356 | 2 or less |
| Sol. 10 | 180 | 351 | 2 or less |
| | 250 | 358 | 2 or less |
| | 350 | 344 | 2 or less |
| | 450 | 351 | 2 or less |
| Sol. 11 | 180 | 344 | 2 or less |
| | 250 | 353 | 2 or less |
| | 350 | 353 | 2 or less |
| | 450 | 351 | 2 or less |
| Sol. 12 | 180 | 355 | 2 or less |
| | 250 | 349 | 2 or less |
| | 350 | 352 | 2 or less |
| | 450 | 350 | 2 or less |
| Sol. 13 | 180 | 347 | 2 or less |
| | 250 | 354 | 2 or less |
| | 350 | 352 | 2 or less |
| | 450 | 359 | 2 or less |
| Sol. 14 | 180 | 343 | 2 or less |
| | 250 | 357 | 2 or less |
| | 350 | 348 | 2 or less |
| | 450 | 344 | 2 or less |
| Sol. 15 | 180 | 342 | 2 or less |
| | 250 | 356 | 2 or less |
| | 350 | 348 | 2 or less |
| | 450 | 352 | 2 or less |
| Sol. 16 | 180 | 360 | 2 or less |
| | 250 | 350 | 2 or less |
| | 350 | 360 | 2 or less |
| | 450 | 356 | 2 or less |
| Sol. 17 | 180 | 359 | 2 or less |
| | 250 | 358 | 2 or less |
| | 350 | 354 | 2 or less |
| | 450 | 356 | 2 or less |
| Sol. 18 | 180 | 358 | 2 or less |
| | 250 | 356 | 2 or less |
| | 350 | 344 | 2 or less |
| | 450 | 352 | 2 or less |
| Sol. 19 | 180 | 349 | 2 or less |
| | 250 | 344 | 2 or less |
| | 350 | 354 | 2 or less |
| | 450 | 354 | 2 or less |
| Sol. 20 | 180 | 359 | 71 |
| | 250 | 342 | 103 |
| | 350 | 347 | 115 |
| | 450 | 343 | 133 |
| Sol. 21 | 180 | 349 | 143 |
| | 250 | 344 | 189 |
| | 350 | 354 | 202 |
| | 450 | 354 | 221 |

As shown in Table 5, the titanium-containing resist underlayer film formed by Sols. 20 and 21 which have a Ti content less than 10% by mass cannot be removed by ammonia-hydrogen peroxide.

Patterning Test

A spin-on carbon film ODL-50 (carbon content: 80% by mass) available from Shin-Etsu Chemical Co., Ltd., was baked at 300° C. on a silicon wafer having a diameter of 8 inches (200 mm) on which a titanium nitride film having a thickness of 30 nm was formed, to form a film having a thickness of 200 nm. The film was coated with each of compositions for forming a titanium-containing resist underlayer film Sols. 1 to 21, and heated at 250° C. for 60 seconds to form a titanium-containing resist underlayer film having a thickness of 35 nm (Films 1 to 21). The following PR-1 was dissolved as a resist composition for ArF excimer laser light exposure in a propylene glycol monomethyl ether acetate (PGMEA) solution containing 0.1% FC-430 (available from Sumitomo 3M, Ltd.), and the solution was filtrated through a 0.1-μm fluorocarbon resin filter to prepare a photoresist film.

PR-1

Resin:

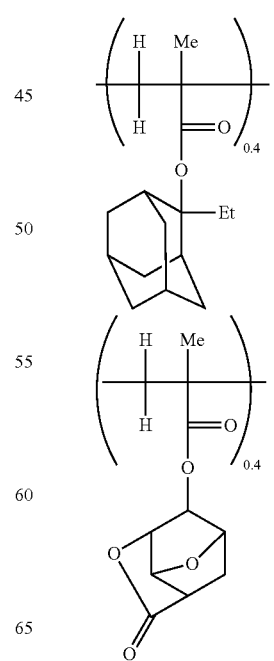

-continued

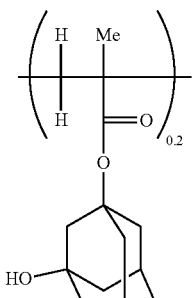

Mw = 6,800

(Me represents a methyl group and Et represents an ethyl group) 10 parts by mass
Photoacid generator: triphenylsulfonium nonafluoro butanesulfonate 0.2 part by mass
Basic compound: triethanolamine 0.02 part by mass The resist films were exposed using an ArF exposure device (manufactured by Nikon Corporation; NA: 0.68, σ: 0.85, ⅔ cycle lighting, Cr mask), then baked (PEB) at 110° C. for 90 seconds, and developed with an aqueous solution of 2.38% tetramethylammonium hydroxide (TNAH), thereby giving a positive pattern having line and space of 100 nm. In the resulting pattern, pattern fall was observed with an electron microscope (CG4000) manufactured by Hitachi High-Technologies Corporation., and the cross-sectional form was observed with an electron microscope (S-9380) manufactured by Hitachi, Ltd. The results are shown in Table 6.

TABLE 6

| No. | Titanium-containing resist underlayer film | ArF resist | Form of cross section of pattern after development | Pattern fall |
| --- | --- | --- | --- | --- |
| Sol. 1 | Film 1 | PR-1 | Vertical form | None |
| Sol. 2 | Film 2 | PR-1 | Vertical form | None |
| Sol. 3 | Film 3 | PR-1 | Vertical form | None |
| Sol. 4 | Film 4 | PR-1 | Vertical form | None |
| Sol. 5 | Film 5 | PR-1 | Vertical form | None |
| Sol. 6 | Film 6 | PR-1 | Vertical form | None |
| Sol. 7 | Film 7 | PR-1 | Vertical form | None |
| Sol. 8 | Film 8 | PR-1 | Vertical form | None |
| Sol. 9 | Film 9 | PR-1 | Vertical form | None |
| Sol. 10 | Film 10 | PR-1 | Vertical form | None |
| Sol. 11 | Film 11 | PR-1 | Vertical form | None |
| Sol. 12 | Film 12 | PR-1 | Vertical form | None |
| Sol. 13 | Film 13 | PR-1 | Vertical form | None |
| Sol. 14 | Film 14 | PR-1 | Vertical form | None |
| Sol. 15 | Film 15 | PR-1 | Vertical form | None |
| Sol. 16 | Film 16 | PR-1 | Vertical form | None |
| Sol. 17 | Film 17 | PR-1 | Vertical form | None |
| Sol. 18 | Film 18 | PR-1 | Vertical form | None |
| Sol. 19 | Film 19 | PR-1 | Vertical form | None |
| Sol. 20 | Film 20 | PR-1 | Vertical form | None |
| Sol. 21 | Film 21 | PR-1 | Vertical form | None |

Patter Etching Test

The titanium-containing resist underlayer film was dry etched under a condition (1) using the resist pattern produced in the patterning test as a mask, followed by dry etching under a condition (2), and the pattern was transferred onto a spin-on carbon film. The resulting pattern was immersed in ammonia-hydrogen peroxide at 23° C. for 20 minutes, and the presence or absence of residue was confirmed with an electron microscope (S-9380) manufactured by Hitachi, Lid. The results are shown in Table 7.

(1) Etching Condition of $CF_4$ Gas
Device: dry etching device Telius SP manufactured by Tokyo Electron Limited
Etching condition:
Chamber pressure: 15 Pa
Upper/Lower RF power: 500 W/300 W
$CF_4$ gas flow rate: 200 mL/min
Ar gas flow rate: 100 mL/min
Treatment time: 40 sec
(2) Etching Condition of $O_2/N_2$ Gas
Device: dry etching device Telius SP manufactured by Tokyo Electron Limited
Etching condition:
Chamber pressure: 5 Pa
Upper/Lower RF power: 1000 W/300 W
$O_2$ gas flow rate: 300 mL/min
$N_2$ gas flow rate: 100 mL/min
Ar gas flow rate: 100 mL/min
Treatment time: 30 sec

TABLE 7

| No | Titanium-containing resist underlayer film pattern | CVD titanium nitride film |
| --- | --- | --- |
| Film 1 | No residue | No residue |
| Film 2 | No residue | No residue |
| Film 3 | No residue | No residue |
| Film 4 | No residue | No residue |
| Film 5 | No residue | No residue |
| Film 6 | No residue | No residue |
| Film 7 | No residue | No residue |
| Film 8 | No residue | No residue |
| Film 9 | No residue | No residue |
| Film 10 | No residue | No residue |
| Film 11 | No residue | No residue |
| Film 12 | No residue | No residue |
| Film 13 | No residue | No residue |
| Film 14 | No residue | No residue |
| Film 15 | No residue | No residue |
| Film 16 | No residue | No residue |
| Film 17 | No residue | No residue |
| Film 18 | No residue | No residue |
| Film 19 | No residue | No residue |
| Film 20 | Residue | No residue |
| Film 21 | Residue | No residue |

As shown in Table 7, a titanium nitride film as a titanium-containing hard mask and a titanium-containing resist underlayer film can be simultaneously removed under a mild condition using ammonia-hydrogen peroxide. Such a body to be processed can be used in a step such as double patterning process. On the other hand, the titanium-containing resist underlayer film having a Ti content less than 10% by mass cannot be removed by ammonia-hydrogen peroxide.

As described above, according to the patterning process of the present invention, it is clear that a resist underlayer film can be removed using a wet stripper having a milder condition than the conventional stripper can be obtained without causing damage to the body to be processed.

The present invention is not restricted to the embodiments shown above. The embodiments shown above are merely examples so that any embodiments composed of substantially the same technical concept as disclosed in the claims of the present invention and expressing a similar effect are included in the technical scope of the present invention.

What is claimed is:

1. A patterning process comprising the steps of:
   (1) forming, on a body to be processed on which a titanium-containing hard mask is formed, an organic underlayer film by using an application-type organic underlayer film composition;
   (2) forming, on the organic underlayer film, a titanium-containing resist underlayer film by using a composition for forming a titanium-containing resist underlayer film, the composition containing titanium in the amount of 10% to 60% by mass;
   (3) forming a photoresist film by using a chemically amplified resist composition on the titanium-containing resist underlayer film;
   (4) after heat-treatment, forming a photoresist pattern by exposing the photoresist film to high energy beam and developing;
   (5) pattern-transferring onto the titanium-containing resist underlayer film by using the photoresist pattern as a mask;
   (6) pattern-transferring onto the organic underlayer film by using the titanium-containing resist underlayer film having the transferred pattern as a mask;
   (7) removing an exposed area of the titanium-containing hard mask and the titanium-containing resist underlayer film by wet stripping method.

2. A patterning process comprising the steps of:
   (1) forming, on a body to be processed on which a titanium-containing hard mask is formed, an organic hard mask mainly comprising carbon by a CVD method;
   (2) forming, on the organic hard mask, a titanium containing resist underlayer film by using a composition for forming a titanium-containing resist underlayer film, the composition containing titanium in the amount of 10% to 60% by mass;
   (3) forming a photoresist film by using a chemically amplified resist composition on the titanium-containing resist underlayer film;
   (4) after heat-treatment, forming a photoresist pattern by exposing the photoresist film to high energy beam and developing;
   (5) pattern-transferring onto the titanium-containing resist underlayer film by using the photoresist pattern as a mask;
   (6) pattern-transferring onto the organic hard mask by using the titanium-containing resist underlayer film having the transferred pattern as a mask;
   (7) removing an exposed area of the titanium-containing hard mask and the titanium-containing resist underlayer film by wet stripping method.

3. The patterning process according to claim 1, wherein the photoresist pattern is a positive-pattern formed by development conducted by dissolving an exposed area of the photoresist film with an alkaline developer.

4. The patterning process according to claim 2, wherein the photoresist pattern is a positive-pattern formed by development conducted by dissolving an exposed area of the photoresist film with an alkaline developer.

5. The patterning process according to claim 1, wherein the photoresist pattern is a negative-pattern formed by development conducted by dissolving an unexposed area of the photoresist film with an organic solvent developer.

6. The patterning process according to claim 2, wherein the photoresist pattern is a negative-pattern formed by development conducted by dissolving an unexposed area of the photoresist film with an organic solvent developer.

7. The patterning process according to claim 1, wherein, in the step of removing by wet stripping method, the exposed area of the titanium-containing hard mask and the titanium-containing resist underlayer film is removed by a stripper containing hydrogen peroxide.

8. The patterning process according to claim 2, wherein, in the step of removing by wet stripping method, the exposed area of the titanium-containing hard mask and the titanium-containing resist underlayer film is removed by a stripper containing hydrogen peroxide.

9. The patterning process according to claim 1, wherein, in the step of removing by wet stripping method, the exposed area of the titanium-containing hard mask and the titanium-containing resist underlayer film is stripped simultaneously.

10. The patterning process according to claim 2, wherein, in the step of removing by wet stripping method, the exposed area of the titanium-containing hard mask and the titanium-containing resist underlayer film is stripped simultaneously.

11. The patterning process according to claim 7, wherein, in the step of removing by wet stripping method, the exposed area of the titanium-containing hard mask and the titanium-containing resist underlayer film is stripped simultaneously.

12. The patterning process according to claim 8, wherein, in the step of removing by wet stripping method, the exposed area of the titanium-containing hard mask and the titanium-containing resist underlayer film is stripped simultaneously.

13. The patterning process according to claim 1, wherein, in the step of removing by wet stripping method, the stripping-rate of the titanium-containing resist underlayer film is faster than that of the exposed area of the titanium-containing hard mask.

14. The patterning process according to claim 2, wherein, in the step of removing by wet stripping method, the stripping-rate of the titanium-containing resist underlayer film is faster than that of the exposed area of the titanium-containing hard mask.

15. The patterning process according to claim 11, wherein, in the step of removing by wet stripping method, the stripping-rate of the titanium-containing resist underlayer film is faster than that of the exposed area of the titanium-containing hard mask.

16. The patterning process according to claim 12, wherein, in the step of removing by wet stripping method, the stripping-rate of the titanium-containing resist underlayer film is faster than that of the exposed area of the titanium-containing hard mask.

17. The patterning process according to claim 1, wherein the titanium-containing hard mask is any one of a titanium film, a titanium carbide film, a titanium oxide film, a titanium nitride film, a titanium silicide film, a titanium oxycarbide film, a titanium carbon nitride film, a titanium oxynitride film.

18. The patterning process according to claim 2, wherein the titanium-containing hard mask is any one of a titanium film, a titanium carbide film, a titanium oxide film, a titanium nitride film, a titanium silicide film, a titanium oxycarbide film, a titanium carbon nitride film, a titanium oxynitride film.

19. The patterning process according to claim 1, wherein the titanium-containing hard mask is formed by a spin-coating method, a CVD method or an ALD method.

20. The patterning process according to claim 2, wherein the titanium-containing hard mask is formed by a spin-coating method, a CVD method or an ALD method.

21. The patterning process according to claim 17, wherein the titanium-containing hard mask is formed by a spin-coating method, a CVD method or an ALD method.

22. The patterning process according to claim 18, wherein the titanium-containing hard mask is formed by a spin-coating method, a CVD method or an ALD method.

23. The patterning process according to claim 1, wherein the body to be processed is a semiconductor substrate coated, as a layer to be processed, with any of a metal film, a metal carbide film, a metal oxide film, a metal nitride film, a metal oxycarbide film, and a metal oxynitride film.

24. The patterning process according to claim 2, wherein the body to be processed is a semiconductor substrate coated, as a layer to be processed, with any of a metal film, a metal carbide film, a metal oxide film, a metal nitride film, a metal oxycarbide film, and a metal oxynitride film.

25. The patterning process according to claim 1, wherein the metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

26. The patterning process according to claim 2, wherein the metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

27. The patterning process according to claim 23, wherein the metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

28. The patterning process according to claim 24, wherein the metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

29. The patterning process according to claim 1, wherein the photoresist film is exposed by the method of photolithography with the wavelength of 300 nm or less or an EUV beam or by the method of a direct drawing with an electron beam.

30. The patterning process according to claim 2, wherein the photoresist film is exposed by the method of photolithography with the wavelength of 300 nm or less or an EUV beam or by the method of a direct drawing with an electron beam.

31. The patterning process according to claim 1, wherein the composition for forming a titanium-containing resist underlayer film contains, as a component (A), a titanium-containing compound obtained by hydrolysis and/or condensation of one or more kinds of titanium compounds shown by the following general formula (A-I), $$Ti(OR^{OA})_4 \quad \text{(A-I)}$$

wherein, $R^{OA}$ represents an organic group having 1 to 30 carbon atoms.

32. The patterning process according to claim 2, wherein the composition for forming a titanium-containing resist underlayer film contains, as a component (A), a titanium-containing compound obtained by hydrolysis and/or condensation of one or more kinds of titanium compounds shown by the following general formula (A-I), $$Ti(OR^{OA})_4 \quad \text{(A-I)}$$

wherein, $R^{OA}$ represents an organic group having 1 to 30 carbon atoms.

33. The patterning process according to claim 1, wherein the composition for forming a titanium-containing resist underlayer film contains, as a component (B), a silicon-containing compound obtained by hydrolysis and/or condensation of one or more kinds of silicon compounds shown by the following general formula (B-I), $$R^{1B}{}_{b1}R^{2B}{}_{b2}R^{3B}{}_{b3}Si(OR^{OB})_{(4-b1-b2-b3)} \quad \text{(B-I)}$$

wherein, $R^{OB}$ represents a hydrocarbon group having 1 to 6 carbon atoms; $R^{1B}$, $R^{2B}$ and $R^{3B}$ represent a hydrogen atom or a monovalent organic group having 1 to 30 carbon atoms; and b1, b2 and b3 represent 0 or 1 and satisfy $1 \leq b1+b2+b3 \leq 3$.

34. The patterning process according to claim 2, wherein the composition for forming a titanium-containing resist underlayer film contains, as a component (B), a silicon-containing compound obtained by hydrolysis and/or condensation of one or more kinds of silicon compounds shown by the following general formula (B-I), $$R^{1B}{}_{b1}R^{2B}{}_{b2}R^{3B}{}_{b3}Si(OR^{OB})_{(4-b1-b2-b3)} \quad \text{(B-I)}$$

wherein, $R^{OB}$ represents a hydrocarbon group having 1 to 6 carbon atoms; $R^{1B}$, $R^{2B}$ and $R^{3B}$ represent a hydrogen atom or a monovalent organic group having 1 to 30 carbon atoms; and b1, b2 and b3 represent 0 or 1 and satisfy $1 \leq b1+b2+b3 \leq 3$.

35. The patterning process according to claim 31, wherein the composition for forming a titanium-containing resist underlayer film contains, as a component (B), a silicon-containing compound obtained by hydrolysis and/or condensation of one or more kinds of silicon compounds shown by the following general formula (B-I), $$R^{1B}{}_{b1}R^{2B}{}_{b2}R^{3B}{}_{b3}Si(OR^{OB})_{(4-b1-b2-b3)} \quad \text{(B-I)}$$

wherein, $R^{OB}$ represents a hydrocarbon group having 1 to 6 carbon atoms; $R^{1B}$, $R^{2B}$ and $R^{3B}$ represent a hydrogen atom or a monovalent organic group having 1 to 30 carbon atoms; and b1, b2 and b3 represent 0 or 1 and satisfy $1 \leq b1+b2+b3 \leq 3$.

36. The patterning process according to claim 32, wherein the composition for forming a titanium-containing resist underlayer film contains, as a component (B), a silicon-containing compound obtained by hydrolysis and/or condensation of one or more kinds of silicon compounds shown by the following general formula (B-I), $$R^{1B}{}_{b1}R^{2B}{}_{b2}R^{3B}{}_{b3}Si(OR^{OB})_{(4-b1-b2-b3)} \quad \text{(B-I)}$$

wherein, $R^{OB}$ represents a hydrocarbon group having 1 to 6 carbon atoms; $R^{1B}$, $R^{2B}$ and $R^{3B}$ represent a hydrogen atom or a monovalent organic group having 1 to 30 carbon atoms; and b1, b2 and b3 represent 0 or 1 and satisfy $1 \leq b1+b2+b3 \leq 3$.

37. The patterning process according to claim 33, wherein the component (B) contains a silicon-containing compound obtained by hydrolysis and/or condensation of one or more kinds of silicon compounds shown by the general formula (B-I) and one or more kinds of silicon compounds shown by the following general formula (B-II), $$Si(OR^{4B})_4 \quad \text{(B-II)}$$

wherein, $R^{4B}$ represents a hydrocarbon group having 1 to 6 carbon atoms.

38. The patterning process according to claim 34, wherein the component (B) contains a silicon-containing compound obtained by hydrolysis and/or condensation of one or more kinds of silicon compounds shown by the general formula (B-I) and one or more kinds of silicon compounds shown by the following general formula (B-II), $$Si(OR^{4B})_4 \quad \text{(B-II)}$$

wherein, $R^{4B}$ represents a hydrocarbon group having 1 to 6 carbon atoms.

39. The patterning process according to claim 35, wherein the component (B) contains a silicon-containing compound obtained by hydrolysis and/or condensation of one or more kinds of silicon compounds shown by the general formula (B-I) and one or more kinds of silicon compounds shown by the following general formula (B-II), $$Si(OR^{4B})_4 \quad (B\text{-}II)$$

wherein, $R^{4B}$ represents a hydrocarbon group having 1 to 6 carbon atoms.

40. The patterning process according to claim 36, wherein the component (B) contains a silicon-containing compound obtained by hydrolysis and/or condensation of one or more kinds of silicon compounds shown by the general formula (B-I) and one or more kinds of silicon compounds shown by the following general formula (B-II), $$Si(OR^{4B})_4 \quad (B\text{-}II)$$

wherein, $R^{4B}$ represents a hydrocarbon group having 1 to 6 carbon atoms.

41. The patterning process according to claim 33, wherein any one or more of $R^{1B}$, $R^{2B}$ and $R^{3B}$ in the general formula (B-I) is an organic group containing a hydroxyl group or a carboxyl group, the groups being substituted with an acid-labile group.

42. The patterning process according to claim 34, wherein any one or more of $R^{1B}$, $R^{2B}$ and $R^{3B}$ in the general formula (B-I) is an organic group containing a hydroxyl group or a carboxyl group, the groups being substituted with an acid-labile group.

43. The patterning process according to claim 35, wherein any one or more of $R^{1B}$, $R^{2B}$ and $R^{3B}$ in the general formula (B-I) is an organic group containing a hydroxyl group or a carboxyl group, the groups being substituted with an acid-labile group.

44. The patterning process according to claim 36, wherein any one or more of $R^{1B}$, $R^{2B}$ and $R^{3B}$ in the general formula (B-I) is an organic group containing a hydroxyl group or a carboxyl group, the groups being substituted with an acid-labile group.

45. The patterning process according to claim 39, wherein any one or more of $R^{1B}$, $R^{2B}$ and $R^{3B}$ in the general formula (B-I) is an organic group containing a hydroxyl group or a carboxyl group, the groups being substituted with an acid-labile group.

46. The patterning process according to claim 40, wherein any one or more of $R^{1B}$, $R^{2B}$ and $R^{3B}$ in the general formula (B-I) is an organic group containing a hydroxyl group or a carboxyl group, the groups being substituted with an acid-labile group.

* * * * *